(12) United States Patent
Li et al.

(10) Patent No.: US 9,876,123 B2
(45) Date of Patent: Jan. 23, 2018

(54) NON-VOLATILE ONE-TIME PROGRAMMABLE MEMORY DEVICE

(71) Applicant: QUALCOMM Incorporated, San Diego, CA (US)

(72) Inventors: Xia Li, San Diego, CA (US); Jeffrey Junhao Xu, San Diego, CA (US); Xiao Lu, San Diego, CA (US); Bin Yang, San Diego, CA (US); Jun Yuan, San Diego, CA (US); Xiaonan Chen, San Diego, CA (US); Zhongze Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 34 days.

(21) Appl. No.: 14/495,507

(22) Filed: Sep. 24, 2014

(65) Prior Publication Data

US 2016/0020220 A1    Jan. 21, 2016

Related U.S. Application Data

(60) Provisional application No. 62/025,138, filed on Jul. 16, 2014.

(51) Int. Cl.

| | | |
|---|---|---|
| *G11C 16/10* | (2006.01) | |
| *H01L 29/792* | (2006.01) | |
| *H01L 29/423* | (2006.01) | |
| *H01L 29/51* | (2006.01) | |
| *G11C 17/18* | (2006.01) | |
| *H01L 27/112* | (2006.01) | |

(Continued)

(52) U.S. Cl.
CPC ............ *H01L 29/792* (2013.01); *G11C 17/18* (2013.01); *H01L 27/11206* (2013.01); *H01L 29/4234* (2013.01); *H01L 29/513* (2013.01); *H01L 29/517* (2013.01); *G11C 16/0466* (2013.01); *G11C 16/10* (2013.01); *G11C 16/26* (2013.01)

(58) Field of Classification Search
CPC ......... G11C 16/10; G11C 16/26; G11C 17/16; G11C 17/18; H01L 27/11233; H01L 27/11573; H01L 29/792
USPC ...................... 365/185.18, 104, 96, 148, 158
See application file for complete search history.

(56) References Cited

U.S. PATENT DOCUMENTS 8,273,618 B2    9/2012 Andreoni et al.
8,422,265 B2    4/2013 Hui et al.
(Continued)

OTHER PUBLICATIONS

Southwick III, et al., Preliminary Study of the Breakdown Strength of TiN/HfO2/SiO2/Si MOS Gate Stacks, 2006 IIRW Final Report.*
Rahim, et al. "Role of Bulk HfO2 and Interfacial SiO2 layer in Breakdown Characteristics of TiN/HfO2/SiO2/Si Gate Stacks", ECS Transactions, 11 (4) 629-638 (2007).*
(Continued)

*Primary Examiner* — Gene Auduong
(74) *Attorney, Agent, or Firm* — Toler Law Group, PC.

(57) ABSTRACT

An apparatus includes a metal gate, a substrate material, and an oxide layer between the metal gate and the substrate material. The oxide layer includes a hafnium oxide layer contacting the metal gate and a silicon dioxide layer contacting the substrate material and contacting the hafnium oxide layer. The metal gate, the substrate material, and the oxide layer are included in a one-time programmable (OTP) memory device. The OTP memory device includes a transistor. A non-volatile state of the OTP memory device is based on a threshold voltage shift of the OTP memory device.

33 Claims, 12 Drawing Sheets

(51) Int. Cl.
    *G11C 16/26*    (2006.01)
    *G11C 16/04*    (2006.01)

(56) References Cited

U.S. PATENT DOCUMENTS

| | | | |
|---|---|---|---|
| 8,541,821 B2 | 9/2013 | Batra et al. | |
| 8,686,490 B2 | 4/2014 | Chen et al. | |
| 9,076,791 B1* | 7/2015 | Chi | H01L 29/513 |
| 9,251,898 B2* | 2/2016 | Katayama | H01L 27/101 |
| 9,508,439 B2* | 11/2016 | Li | G11C 16/10 |
| 9,659,944 B2* | 5/2017 | Zhang | H01L 27/11233 |
| 2009/0189215 A1 | 7/2009 | Samanta et al. | |
| 2015/0221394 A1* | 8/2015 | Shin | G11C 17/16 365/96 |
| 2015/0243888 A1* | 8/2015 | Hopstaken | H01L 45/16 438/382 |

OTHER PUBLICATIONS

Buckley, J. et al., "Investigation of SiO2/HfO2 Gate Stacks for Application to Non-Volatile Memory Devices," Solid State Electronics, vol. 49, No. 11, Elsevier, Nov. 2005, pp. 1833-1840.

International Search Report and Written Opinion—PCT/US2015/037529—ISA/EPO—Sep. 16, 2015.

Lee, T. et al., "Reduced Gate-Leakage Current and Charge Trapping Characteristics of Dysprosium-Incorporated HfO2 Gate-Oxide n-MOS Devices," IEEE Transactions on Electron Devices, vol. 58, No. 2, Feb. 2011, pp. 562-566.

Vandelli, L. et al., "A Physical Model of the Temperature Dependence of the Current Through SiO2/HfO2 Stacks," IEEE Transactions on Electron Devices, vol. 58, No. 9, Sep. 2011, pp. 2878-2887.

Zhang, Y. et al., "Temperature Dependant Characteristics of Scaled NMOS Transistors with Ultra-Thin High-K Dielectrics and Metal Gate Electrodes," IEEE International Semiconductor Device Research Symposium, 2007, pp. 1-2.

* cited by examiner

First Non-Volatile Programmable State
(e.g., "Low Threshold Voltage Device")

Second Non-Volatile Programmable State
(e.g., "High Threshold Voltage Device")

Fresh Device, Pre program

Post program, Flat Band Increased

NON-VOLATILE ONE-TIME PROGRAMMABLE MEMORY DEVICE

I. CLAIM OF PRIORITY

The present application claims priority from U.S. Provisional Patent Application No. 62/025,138, entitled "NON-VOLATILE ONE-TIME PROGRAMMABLE MEMORY DEVICE," filed Jul. 16, 2014, the contents of which are incorporated by reference in their entirety.

II. FIELD

The present disclosure is generally related to a non-volatile one-time programmable memory device.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Wireless telephones and other electronic devices may include memory devices to store information. Conventional memory devices may include volatile memory devices (e.g., memory devices that store data so long as a voltage is applied to the memory devices) and non-volatile memory devices (e.g., memory devices that store data regardless of whether voltage is applied to the memory devices). For example, metal-oxide semiconductor (MOS) transistors may be used in wireless telephones as volatile memory devices. However, conventional MOS transistors cannot store data in a non-volatile state.

IV. SUMMARY

Techniques and methods to store non-volatile programmable states in a one-time programmable (OTP) memory device are disclosed. An OTP memory device may include a metal gate and a high dielectric constant (k) oxide layer (e.g., hafnium oxide) or a poly gate and silicon oxide layer. A threshold voltage of the OTP memory device may be related to a charge trap, an orientation of the ferroelectric field, or interface defect generation which may cause metal gate Fermi level re-pinning, etc. When the hafnium oxide comes into contact with silicon oxide, a ferroelectric field and dipole may be generated. To illustrate, a threshold voltage of an n-type OTP device (e.g., an n-type metal oxide semiconductor (NMOS) transistor) may change based on an orientation of a ferroelectric field. For example, the threshold voltage of the n-type OTP memory device may increase when the ferroelectric field has a "downward" orientation, and the threshold voltage of the n-type OTP memory device may decrease when the ferroelectric field has an "upward" orientation. The "downward" or "upward" switching can happen one time. The orientation of the ferroelectric field for a p-type OTP device (e.g., a p-channel metal oxide semiconductor (PMOS) transistor) may have a reverse affect on the threshold voltage. For example, the threshold voltage of a p-type OTP device may increase when the ferroelectric field has an upward orientation, and the threshold voltage of the p-type OTP memory device may decrease when the ferroelectric field has a downward orientation. However, based on I-V curves of PMOS OTP devices, PMOS OTP switching may not be based on ferroelectric interface dipole switching, but rather may relate to charge trap or interface defect generation which cause Fermi level re-pinning or other mechanisms.

Varying the threshold voltage of the OTP memory device, and thus varying a flat-band voltage of the OTP memory device, work function, Fermi level, or charge trap in dielectric, may cause the OTP memory device to operate in different modes. For example, the OTP memory device may operate in an original threshold voltage mode when the OTP is not programmed to increase the threshold voltage (Vt) having a first orientation (corresponding to a ferroelectric dipole with a downward orientation), and the OTP memory device may operate in a programmed mode when the flat-band voltage increases, the charge trap changes, or the work function changes to increase a threshold voltage having a second orientation (corresponding to a ferroelectric dipole with an upward orientation or charge trap or work function change, etc.). In the programmed mode, the OTP memory device may correspond to a particular non-volatile programmable state. Compared with the original state, the OTP memory device can be sensed for the non-volatile programmable state. For example, the OTP device may be sensed (e.g., read) from the drain current or the source current to determine whether the OTP device is programmed.

One technique that may be used to vary ferroelectric field (and thus vary the threshold voltage) may include switching a dipole (e.g., an electric dipole) orientation between the hafnium oxide and silicon dioxide; however, the dipole cannot switch back to a previous orientation. For example, silicon dioxide may be coupled between the hafnium oxide and a channel of the OTP memory device. The orientation (e.g., direction) of the dipole may be opposite the orientation of the ferroelectric field. Additionally, an injection charge to the gate dielectric layer may vary the ferroelectric field, or an interface defect to pin the metal gate Fermi level may vary the ferroelectric field, which may change the threshold voltage to represent the programmed state.

The orientation of the dipole between the hafnium oxide and the silicon dioxide may be switched based on a voltage provided to the metal gate. To illustrate with respect to an n-channel metal oxide semiconductor (NMOS) configuration, increasing the voltage applied to the gate may change the dipole orientation to an "upward" orientation and increasing the positive voltage applied to the gate cannot change the dipole orientation to a "downward" orientation. To illustrate with respect to a p-channel metal oxide semiconductor (PMOS) configuration, increasing the negative voltage applied to the gate may change the dipole orientation to a downward orientation and increasing the positive voltage applied to the gate cannot change the dipole orientation to an upward orientation. Another OTP programming technique may include injecting charge into the hafnium oxide ($HfO_2$) layer and trapping charge in hafnium oxide ($HfO_2$) layer. Increasing interface defects may also cause the metal gate Fermi level pinning to shift work function, etc.

In an NMOS configuration, a dipole having a downward orientation (e.g., a ferroelectric field having an upward orientation) may reduce the threshold voltage of the OTP memory device such that the OTP memory device has a first non-volatile programmable state (e.g., a logic "0" state), and a dipole having an upward orientation (e.g., a ferroelectric field having a downward orientation) may increase the threshold voltage of the OTP memory device such that the OTP memory device has a second non-volatile programmable state (e.g., a logic "1" state). In a PMOS configuration, a dipole having an upward orientation (e.g., a ferroelectric field having a downward orientation) may reduce the threshold voltage of the OTP memory device such that the OTP memory device has the first non-volatile programmable state, and a dipole having a downward orientation (e.g., a ferroelectric field having an upward orientation) may increase the threshold voltage of the OTP memory device such that the OTP memory device has the second non-volatile programmable state. If the threshold voltage program or the shift is due to the $HfO_2/SiO_2$ interface dipole for the OTP device, the PMOS OTP may have a very strong dipole.

If the PMOS OTP programming techniques relate to charge trapping inside the dielectric film, it is possible to make the threshold voltage shift for hot hole injection and trap inside gate dielectric film. However, hot carrier injection ("HCI injection") will be reduced for hot temperatures for fixed gate and drain voltages. The PMOS OTP may be easy to program in hot temperatures. For example, a Fowler-Nordheim tunneling current may be weak (e.g., small) during low temperature conditions; and hot temperatures may yield higher Fowler-Nordheim tunneling currents. The Fowler-Nordheim tunneling also can shift the PMOS threshold voltage with higher gate voltage than HCl injection program voltage. So Fowler-Nordheim tunneling may correlate with test results for the PMOS OTP program. When the gate current exceeds a certain level, PMOS OTP programming may commence and the threshold voltage is shifted regardless of HCl injection or Fowler-Nordheim tunneling techniques. A higher gate current may generate charge at an interface (e.g., an $HfO_2$/metal gate interface, a $Si/SiO_2$ interface, or a $SiO_2/HfO_2$ interface) or may generate trap charge in the dielectric. Because a PMOS OTP device has a "significant" threshold voltage shift and an NMOS device does not have the significant threshold voltage shift before soft breakdown, the PMOS OTP programming techniques may generate defects at the $HfO_2/TiN$ metal work function interface and induce P metal gate Fermi level re-pinning after programming. Fermi level pinning may increase flat band voltage and threshold voltage.

In a particular aspect, an apparatus includes a metal gate, a substrate material, and an oxide layer between the metal gate and the substrate material. The oxide layer includes a hafnium oxide layer contacting the metal gate and a silicon dioxide layer contacting the substrate material and contacting the hafnium oxide layer. The metal gate, the substrate material, and the oxide layer are included in a one-time programmable (OTP) memory device. The OTP memory device includes a transistor. A non-volatile state of the OTP memory device is based on a threshold voltage shift of the OTP memory device.

In another particular aspect, a method includes performing a write operation to program a one-time programmable (OTP) memory device to a non-volatile state. The non-volatile state is based on a threshold voltage shift of the OTP memory device, and the OTP memory device includes a transistor that includes a metal gate, a substrate material, and an oxide layer between the metal gate and the substrate material. The oxide layer includes a hafnium oxide layer contacting the metal gate and a silicon dioxide layer contacting the substrate material and contacting the hafnium oxide layer. The method also includes performing a read operation to read the non-volatile state at the OTP memory device.

In another particular aspect, a non-transitory computer-readable medium includes instructions that, when executed by a processor, cause the processor to perform a write operation to program a one-time programmable (OTP) memory device to a non-volatile state. The non-volatile state is based on a threshold voltage shift of the OTP memory device, and the OTP memory device includes a transistor that includes a metal gate, a substrate material, and an oxide layer between the metal gate and the substrate material. The oxide layer includes a hafnium oxide layer contacting the metal gate and a silicon dioxide layer contacting the substrate material and contacting the hafnium oxide layer. The instructions are also executable to cause the processor to perform a read operation to read the non-volatile state at the OTP memory device.

In another particular aspect, an apparatus includes means for receiving a gate voltage signal. The apparatus also includes a substrate material and means for isolating the substrate material from the means for receiving the gate voltage signal. The means for isolating includes a hafnium oxide layer contacting the means for receiving the gate voltage signal and a silicon dioxide layer contacting the substrate material and contacting the hafnium oxide layer. The means for receiving the gate voltage signal, the substrate material, and the means for isolating are included in a one-time programmable (OTP) memory device. The OTP memory device includes a transistor. A non-volatile state of the OTP memory device is based on a threshold voltage shift of the OTP memory device.

In another particular aspect, a method includes receiving design information representing at least one physical property of a semiconductor device. The semiconductor device includes a metal gate, a substrate material, and an oxide layer between the metal gate and the substrate material. The oxide layer includes a hafnium oxide layer contacting the metal gate and a silicon dioxide layer contacting the substrate material and contacting the hafnium oxide layer. The metal gate, the substrate material, and the oxide layer are included in a one-time programmable (OTP) memory device. The OTP memory device includes a transistor. A non-volatile state of the OTP memory device is based on a threshold voltage shift of the OTP memory device. The method also includes transforming the design information to comply with a file format and generating a data file (e.g., a GDSII format data file or a GERBER format data file) including the transformed design information.

One particular advantage provided by at least one of the disclosed embodiments is an ability to use a high dielectric constant (high-K) metal gate (HK/MG) device (e.g., a transistor having high-K dielectric interface coupled to a metal gate) as a non-volatile memory device. An HK/MG device (e.g., a complementary metal oxide semiconductor (CMOS) device) may be cheaper to manufacture than other non-volatile memory devices. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1A:
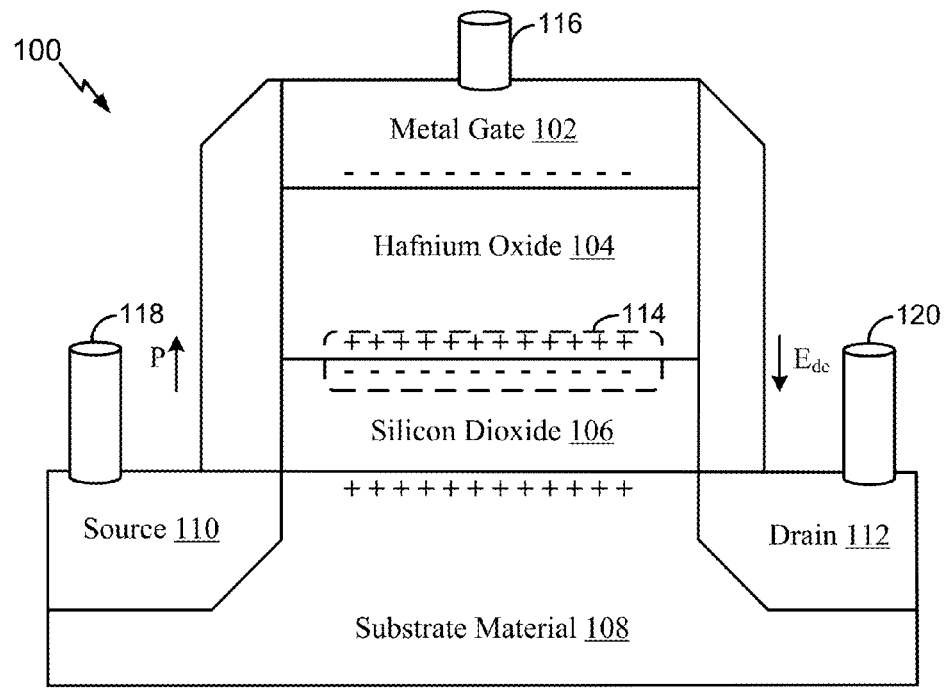
FIG. 1A depicts a one-time programmable (OTP) memory device having a first non-volatile programmable state and a diagram of the OTP memory device having a second non-volatile programmable state by a dipole switching guest model.
Figure 1A:
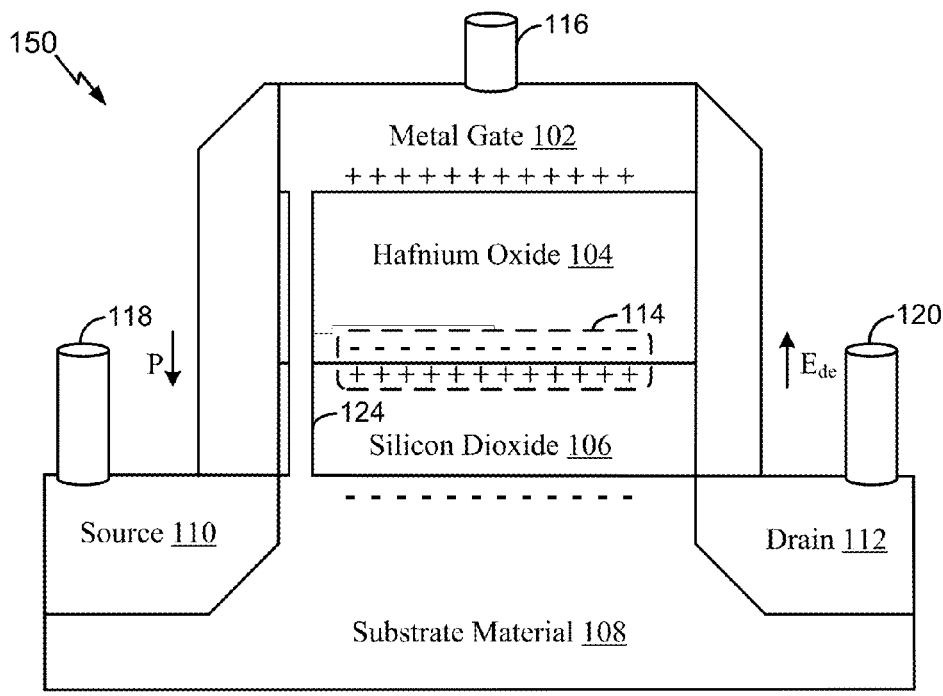

Referring to FIG. 1A, a first embodiment 100 of a device and a second embodiment 150 of the device is shown. In a particular embodiment, the device may be a one-time programmable (OTP) memory device. For example, the device may be a transistor that may be programmed from a first pre program state to a second non-volatile programmable state. The first embodiment 100 represents the device in the first pre program state, and the second embodiment 150 represents the device in the second non-volatile programmable state.

The device may include a metal gate 102, a hafnium oxide layer 104, a silicon dioxide layer 106, substrate material 108, a source 110, and a drain 112. As used herein, an "oxide layer" may correspond to the hafnium oxide layer 104 and the silicon dioxide layer 106. In the illustrated embodiment, the device is a p-type device (e.g., a p-type metal oxide semiconductor (PMOS) transistor). For example, the metal gate 102 may be a p-type metal gate, the substrate material 108 may include an n-type well semiconductor material, the source 110 may include a p-type semiconductor material, and the drain 112 may include a p-type semiconductor material. In another particular embodiment, the device may be an n-type device (e.g., an n-type metal oxide semiconductor (NMOS) transistor). For example, the metal gate 102 may be an n-type metal gate, the substrate material 108 may include a p-type well semiconductor material, the source 110 may include an n-type semiconductor material, and the drain 112 may include an n-type semiconductor material.

Unless otherwise stated, the following description will correspond to a configuration where the device is a p-type device. However, it should be understood by those with ordinary skill in the art that the techniques, methods, and concepts may also be applied to a configuration where the device is an n-type device.

The hafnium oxide layer 104 may include a material having a high dielectric constant (k), such as hafnium oxide ($HfO_2$). Thus, the device may be a high-k metal gate (HK/MG) device. The non-volatile programmable state of the device may be based, at least in part, on ferroelectric interface dipole and a ferroelectric field ($E_{de}$) between the silicon oxide gate 106 and the hafnium oxide layer 104. For example, the ferroelectric field ($E_{de}$) between the silicon dioxide layer 106 and the hafnium oxide layer 104 may be based on a dipole 114 (e.g., a ferroelectric dipole) between the hafnium oxide layer 104 and the silicon dioxide layer 106. In particular, the orientation (e.g., the location of positive and negative charges) of the dipole 114 is opposite of the orientation of the ferroelectric field ($E_{de}$). The dipole 114 may be formed when the hafnium oxide layer 104 comes into contact with the silicon dioxide layer 106 as a result of the two layers 104, 106 having different chemical compositions and densities.

When the ferroelectric field ($E_{de}$) has a first orientation (e.g., a "downward" orientation), the device may have the first pre programmable state, as illustrated in the first embodiment 100. When the ferroelectric field ($E_{de}$) has a second orientation (e.g., an "upward" orientation), the device may have the second non-volatile programmable state, as illustrated in the second embodiment 150. In a particular embodiment, the first pre programmable state corresponds to the device being programmed to a logical "0", and the second non-volatile programmable state corresponds to the device being programmed to a logical "1". However, in alternative embodiments, the first pre programmable state may correspond to the device being programmed to a logical "1", and the second non-volatile programmable state may correspond to the device being programmed to a logical "0".

Referring to the first embodiment 100 of FIG. 1A, when the dipole 114 is characterized by the accumulation of positive charges in the hafnium oxide layer 104 and negative charges in the silicon dioxide layer 106 (e.g., an upward orientation), the orientation of the ferroelectric field ($E_{de}$) is in the "downward" direction. When the dipole 114 has the upward orientation, a threshold voltage of the device may be relatively low. In a particular embodiment, the upward orientation of the dipole 114 (e.g., the relatively low threshold voltage) may shift (e.g., reduce) a flat-band voltage of the device and reduce a channel dopant (e.g., increase a size of a depletion region). Thus, the low threshold voltage may cause the device to represent the first pre programmable state.

Alternatively, when the dipole 114 is characterized by the accumulation of negative charges in the hafnium oxide layer 104 and positive charges in the silicon dioxide layer 106 (e.g., a downward orientation), the orientation of the of the ferroelectric filed ($E_{de}$) is in the "upward" direction (as illustrated in the second embodiment 150). When the dipole 114 has the downward orientation, the threshold voltage of the device may be relatively high. In a particular embodiment, the downward orientation of the dipole 114 (e.g., the relatively high threshold voltage) may increase the flat-band voltage of the device and increase channel dopant (e.g., reduce the size of the depletion region). Thus, the high threshold voltage may cause the device to represent the second non-volatile programmable state.

Thus, switching the orientation of the dipole 114 may change the threshold voltage of the device and the non-volatile programmable state of the device. The orientation of the dipole 114 (and thus the non-volatile programmable state) may be based on a voltage applied to the metal gate 102, a voltage applied to the source 110, and a voltage applied to the drain 112. A first contact 116 may be coupled to provide a first voltage (e.g., a gate voltage) to the metal gate 102, a second contact 118 may be coupled to provide a second voltage (e.g., a source voltage) to the source 110, and a third contact 120 may be coupled to provide a third voltage (e.g., a drain voltage) to the drain 112.

Applying a first write voltage (e.g., a switching voltage) to the metal gate 102 via the first contact 116 that is smaller than the negative gate breakdown voltage of the device may switch the orientation of the dipole 114 from an upward orientation to a downward orientation. Thus, applying the first write voltage to the metal gate 102 may change the pre programmable state of the device from the first pre programmable state to the second non-volatile programmable state. Changing the pre programmable state may occur prior to "soft breakdown." Gate "soft breakdown" means the gate may still control channel current by applying gate voltage, and typically is associated with a PMOS OTP device.

In a particular embodiment, applying the switching voltage to the metal gate 102 may create a breakdown condition 124 at the metal gate 102. For example, when the first write voltage is applied to the metal gate 102 and a second write voltage (e.g., a positive voltage) is applied to the substrate material 108, the potential (e.g., the voltage difference) across the oxide 106 and 104 may be large enough such that the breakdown condition 124 occurs at the oxide 106 and 104 prohibiting the metal gate 102 from controlling current between the source 110 and the drain 112.

The breakdown condition 124 may also be referred to as a "hard breakdown." As used herein, a "hard breakdown" corresponds to a scenario such that a gate can no longer control the amount of current flowing in a channel. Thus, when a device undergoes a hard breakdown, the device may not be switched back to the previous pre programmable state (e.g., the device may not be switched back to the first pre programmable state from the second non-volatile programmable state). When OTP devices are in gate "hard breakdown" mode, PMOS and NMOS devices can be used as OTP devices.

The techniques described with respect to FIG. 1A may be used for implementing high-dielectric constant (k) metal-gate (HK/MG) devices as non-volatile memory devices for logic circuits. For example, the device may be programmed to the first pre programmable state (e.g., the first embodiment 100) for use in a logic circuit or programmed to the second non-volatile programmable state (e.g., the second embodiment 150) for use in a logic circuit. Switching the orientation of the dipole 114 of the device may enable the device to be used as a memory device (e.g., a non-volatile memory device).

Although FIG. 1A is described in the context of switching the orientation of the dipole 114 to switch the orientation of the ferroelectric field ($E_{de}$), in other embodiments, different techniques may be used to switch the orientation of the ferroelectric field ($E_{de}$). As a non-limiting example, injection and/or removing electrons or holes (e.g., charge injection/removal) may be used to switch the threshold voltage of the OTP devices.

Figure 1B:
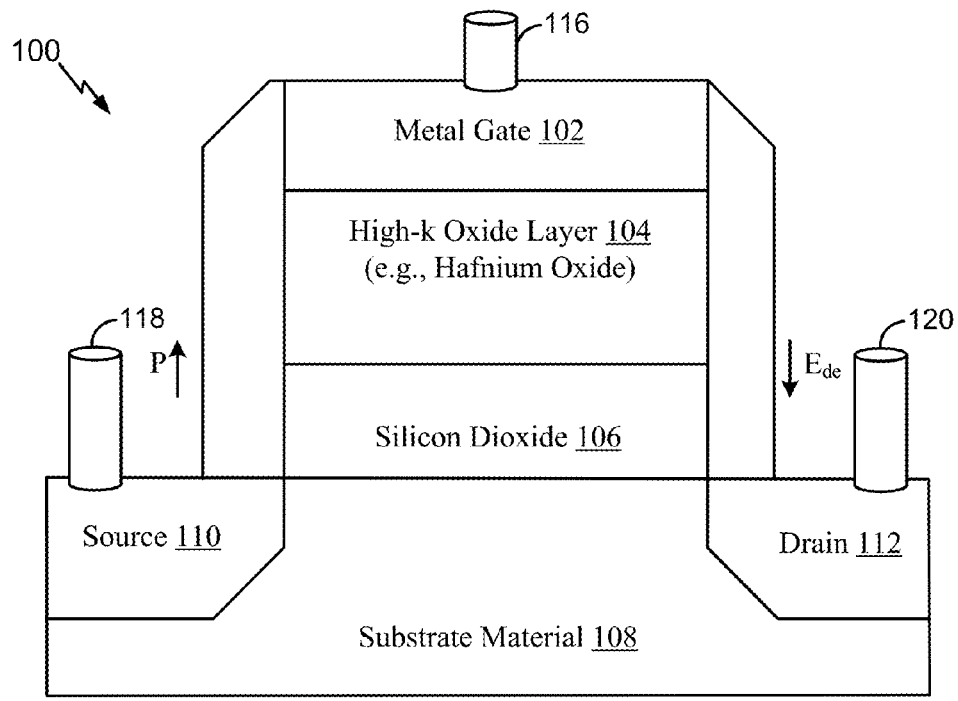
FIG. 1B depicts a one-time programmable (OTP) memory device having a first fresh state and a diagram of the OTP memory device having a second non-volatile programmable state explained by an interface defect generation and Fermi level re-pinning guest model.
Figure 1B:
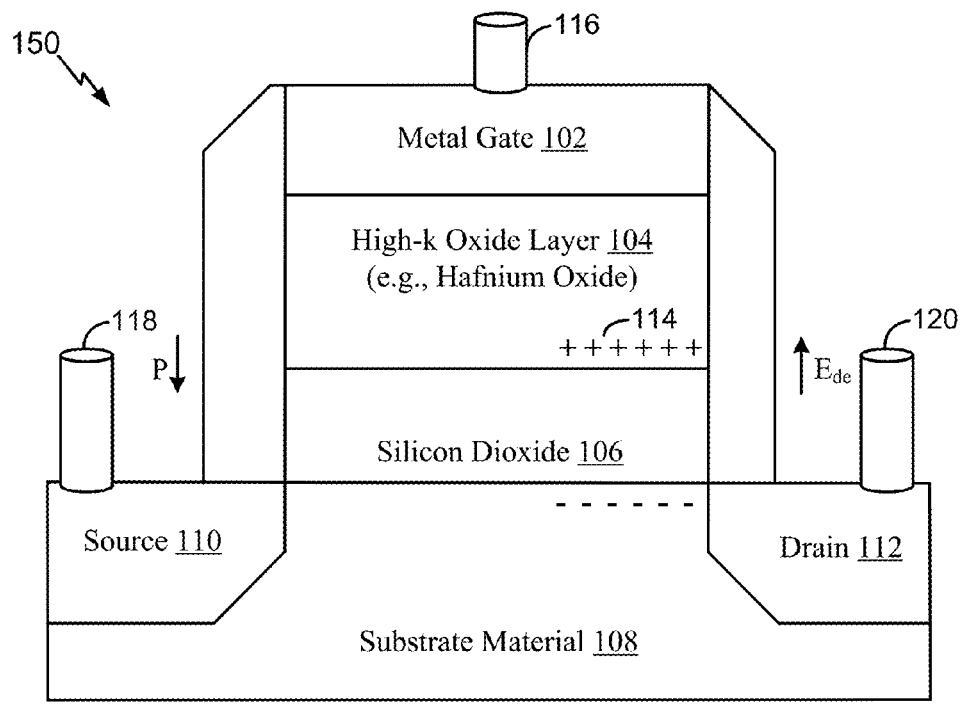

Referring to FIG. 1B, another possible OTP programming technique is illustrated for PMOS OTP devices. In the first pre program state, the high-k/metal gate dielectric may be relatively clean and may have relatively few defects. As a result, the dielectric charge is relatively small and the threshold voltage is relatively low. After a negative voltage is applied to a P metal gate, and a drain voltage is applied, a silicon channel may undergo inversion from N type to P type, the gate current may increase due to HCl injection. Channel hot carrier (CHC) (hole) injection may occur in the gate dielectric and may generate dielectric trap charges in the oxide and high-k dielectric. When dielectric trap charges are generated, the threshold voltage of PMOS will be increased. When a drain voltage is applied, the gate voltage may be increased due to HCl injection and the gate program voltage can be reduced.

Figure 1C:
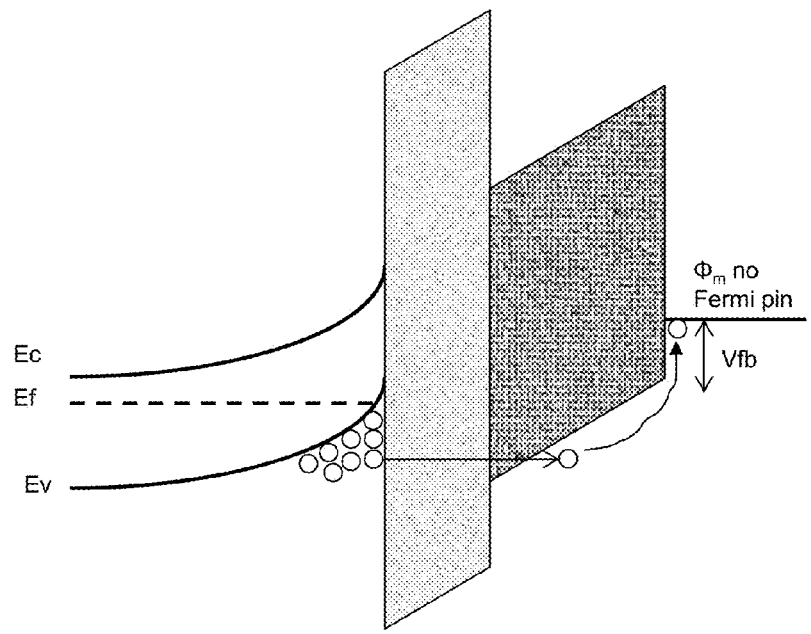
FIG. 1C depicts pre-programming and post-programming Id vs. Vg curves of a p-type metal oxide semiconductor (PMOS) OTP.
Figure 1C:
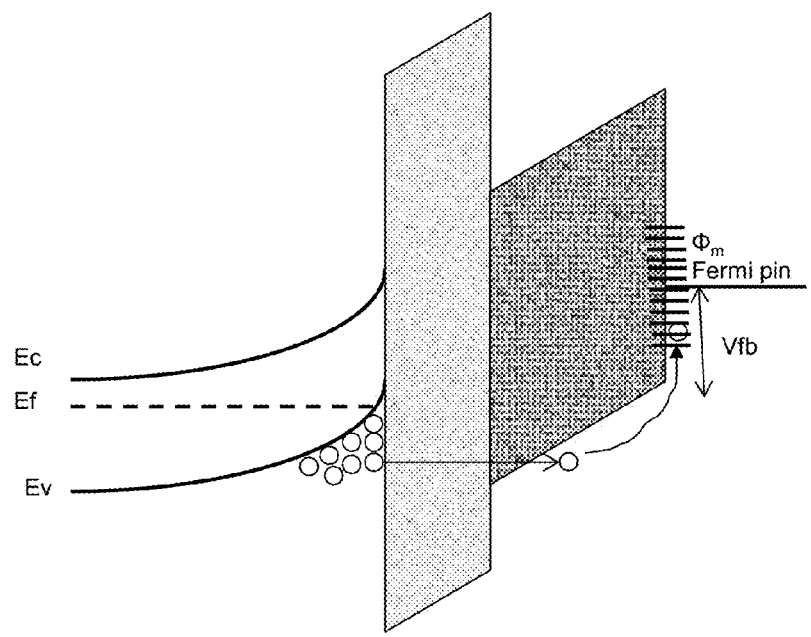

Referring to FIG. 1C, other possible OTP programming technique is illustrated for PMOS OTP devices. In the first pre program state, the high-k/metal gate interface may be relatively clean and may have relatively few defects. As a result, there is reduced metal gate Fermi level pinning. The flat band voltage is relatively small and the threshold voltage is relatively low. After a negative voltage is applied to a P metal gate, a silicon channel may undergo inversion from N type to P type. Holes FN tunneling may occur in the gate dielectric and may generate interface defects at the high-k/metal gate interface. When interface defects are generated, the interface defects can act as donors or acceptors from the metal gate. The interface defects may form a strong dipole between the high-k dielectric and the metal gate, and the dipole may cause metal gate work function Fermi level re-pinning. The flat band voltage may increase and the threshold voltage may increase for a second programmable state. When a drain voltage is applied, the gate current may increase due to HCl injection and the gate program voltage may be reduced.

Figure 1D:
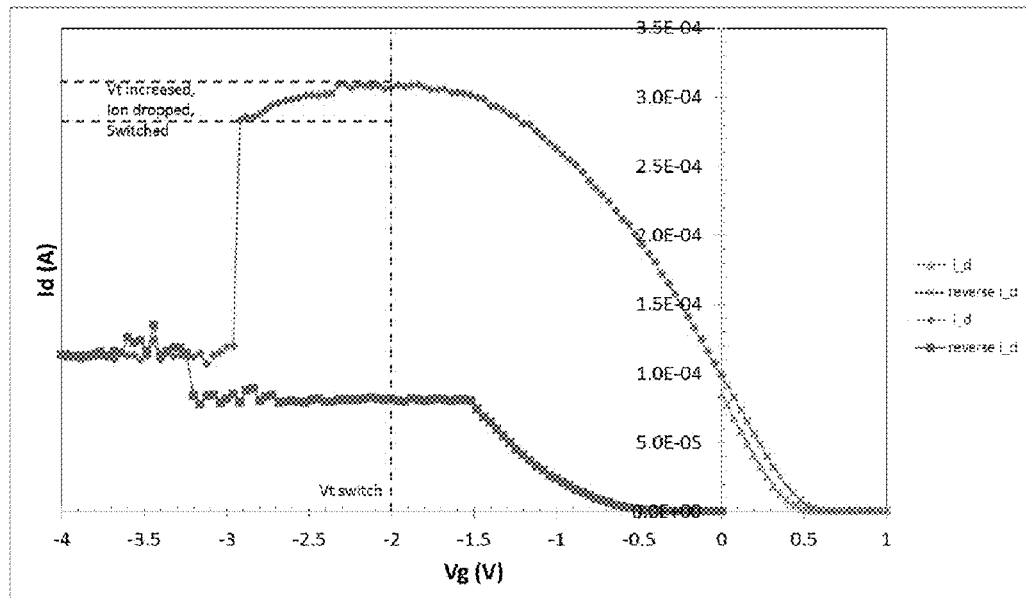
FIG. 1D depicts pre-programming and post-programming Id vs. Vg curves of a PMOS OTP.
Figure 1D:
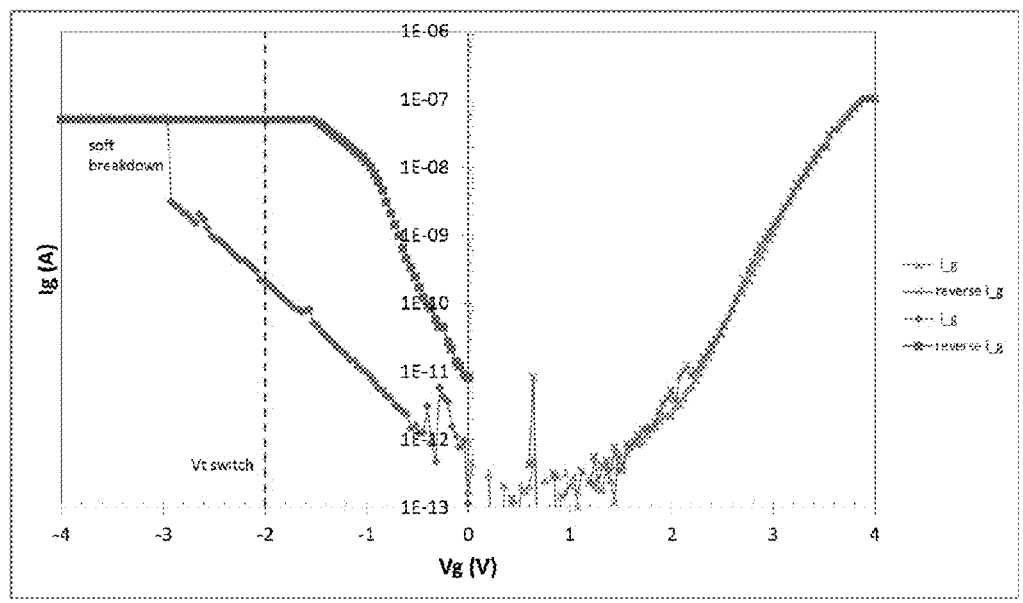

Referring to FIG. 1D, pre-programming and post-programming Id vs. Vg curves of a p-type metal oxide semiconductor (PMOS) OTP are shown. A one volt (1V) signal may be applied to a source and an Nwell, and a ground voltage may be applied to a drain of a PMOS OTP device. For pre programming when the gate voltage (Vg) is larger than –2V, the drain current (Id) increases until Vg=–2V. The threshold voltage begins to increase when the drain current (Id) increases. However, the increase in the threshold voltage may be gradual (e.g., slow), resulting in a weak program state for a threshold voltage shift about 300 mV. When the gate voltage (Vg) is less than –2V and larger than –3V, the drain current (Id) is reduced and the gate current (Ig) has a substantially similar trend. Thus, the threshold voltage may be increased to reduce drain current before soft breakdown at Vg=–3V if current compliance is applied for the gate current. When the gate voltage (Vg) is less than –3V, soft breakdown may occur with gate current compliance. For pre soft breakdown (–2V>Vg>–3V) and soft breakdown (Vg<–3V), the gate voltage can control channel current between source and drain. The gate current is increased for soft breakdown but not increased for pre soft breakdown. Drain current may be significantly reduced during pre soft breakdown and soft breakdown because the threshold voltage is increased. For hard breakdown, there is no gate current compliance, permanent damage occurs to the gate dielectric film, and a conduct path is formed in the gate dielectric film. The gate voltage may lose control of the drain current during hard breakdown, and the drain current may be larger than the pre program state. The pre soft breakdown, soft breakdown, or hard breakdown state can be used as the second non volatile programmable state for the OTP device.

Figure 2:
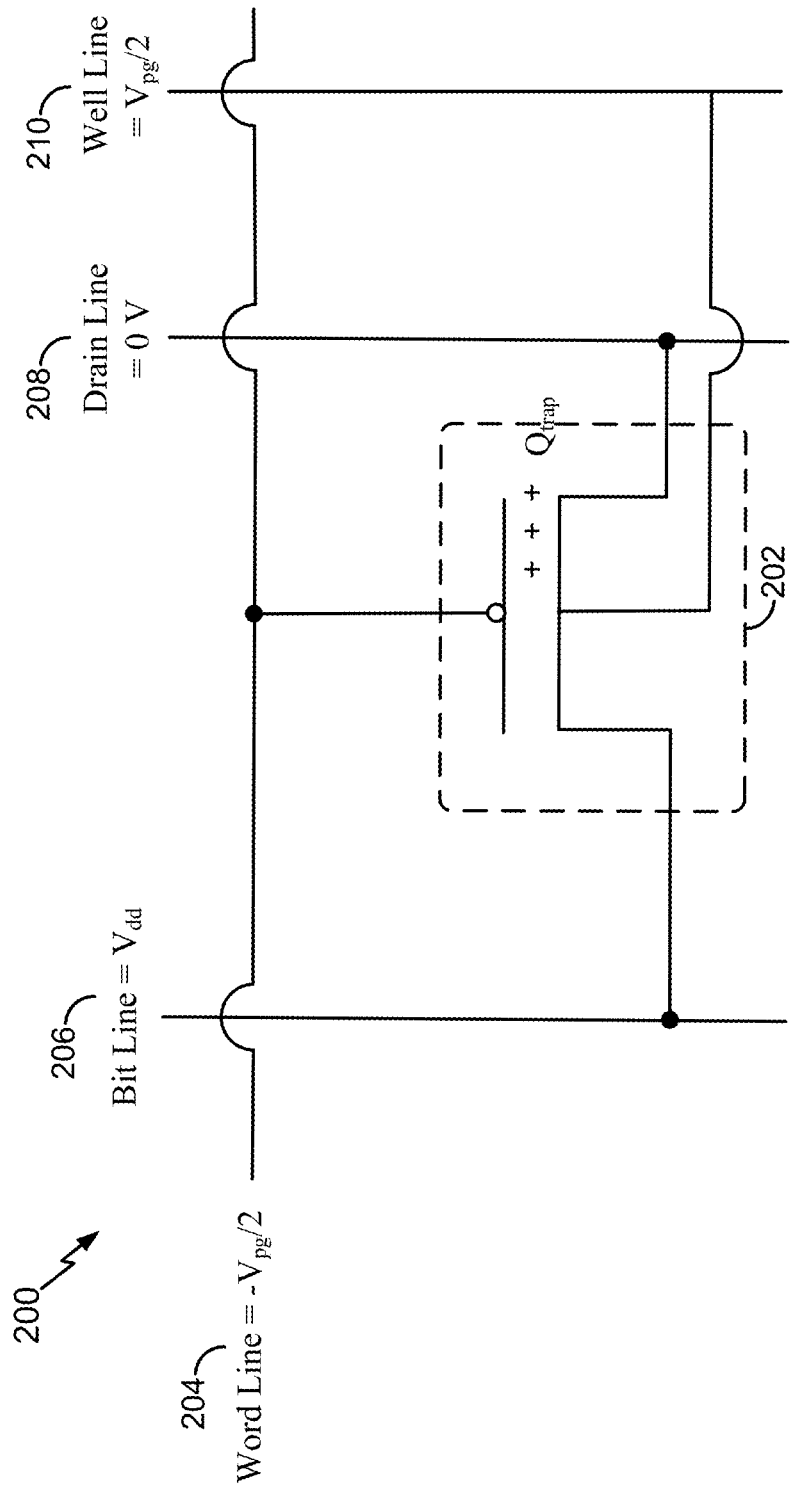
FIG. 2 is a diagram of a particular illustrative embodiment of performing a write operation on an OTP memory device in a single transistor configuration.

Referring to FIG. 2, a diagram of a particular illustrative embodiment 200 of performing a write operation on a one-time programmable (OTP) memory device 202 in a single transistor configuration is shown. In a particular embodiment, the OTP memory device 202 may correspond to the device of FIG. 1B.

A word line 204 may be coupled to a gate of the OTP memory device 202. For example, the word line 204 may be coupled to provide the gate voltage to the metal gate 102 of the device of FIG. 1B via the first contact 116. A bit line 206 may be coupled to a source of the OTP memory device 202. For example, the bit line 206 may be coupled to provide the source voltage to the source 110 of the device of FIG. 1B via the second contact 118. A drain line 208 may be coupled to a drain of the OTP memory device 202. For example, the drain line 208 may be coupled to provide the drain voltage to the drain 112 of the device of FIG. 1B via the third contact 120. A well line 210 may be coupled to a well (e.g., the substrate material 108 of FIG. 1B) of the OTP memory device 202.

During the write operation, the bit line 206 may apply the supply voltage (Vdd) or half the program voltage to the source of the OTP memory device 202, the drain line 208 may apply the ground voltage (e.g., 0 V) to the drain of the OTP memory device 202, and the word line 204 may apply a first write voltage (e.g., $-V_{pg}/2$) to the gate of the OTP memory device 202. Additionally, the well line 210 may apply a second write voltage (e.g., $V_{pg}/2$) to the well of the OTP memory device 202. Applying the first write voltage ($-V_{pg}/2$) to the gate and applying the second write voltage ($V_{pg}/2$) to the well may cause the trap charge $Q_{trap}$ in dielectric layers of the OTP memory device 202 to change threshold voltage from the fresh low Vt to programmed high Vt. For example, the write voltage ($-V_{pg}/2$) may cause the charge trapped in dielectric layers (e.g., the trap charge 114 of FIG. 1B) to increase threshold voltage as described with respect to the second embodiment 150 of FIG. 1B. Adding the trap charge may change the state of the OTP memory device 202 from the first pre programmable state to the second non-volatile programmable state before or at soft breakdown region.

Applying the first write voltage ($-V_{pg}/2$) to the gate and applying the second write voltage ($V_{pg}/2$) to the well may also generate a pre soft breakdown, a soft breakdown, or a hard breakdown at the gate of the OTP memory device 202. For example, the potential (e.g., the voltage difference) across the gate may be large enough such that a "breakdown condition" occurs at the gate and a conduct path is formed in the gate dielectric layer which is prohibiting the gate from controlling current between the source and the drain for hard breakdown. Thus, the hard breakdown at the gate may prohibit the non-volatile programmable state of the OTP memory device 202 to switch back to the first pre programmable state. For soft breakdown, the gate current is in compliance and no hard conduct path is formed in gate dielectric film, but a soft conduct path may exist. The gate voltage may control channel current between source and drain. For pre soft breakdown, the threshold voltage starts to switch, and the OTP device operates as a high threshold voltage device without a gate current increase. The high threshold voltage state (e.g., the second state) cannot switch back to the first pre program state for soft or pre soft breakdown program.

Figure 3:
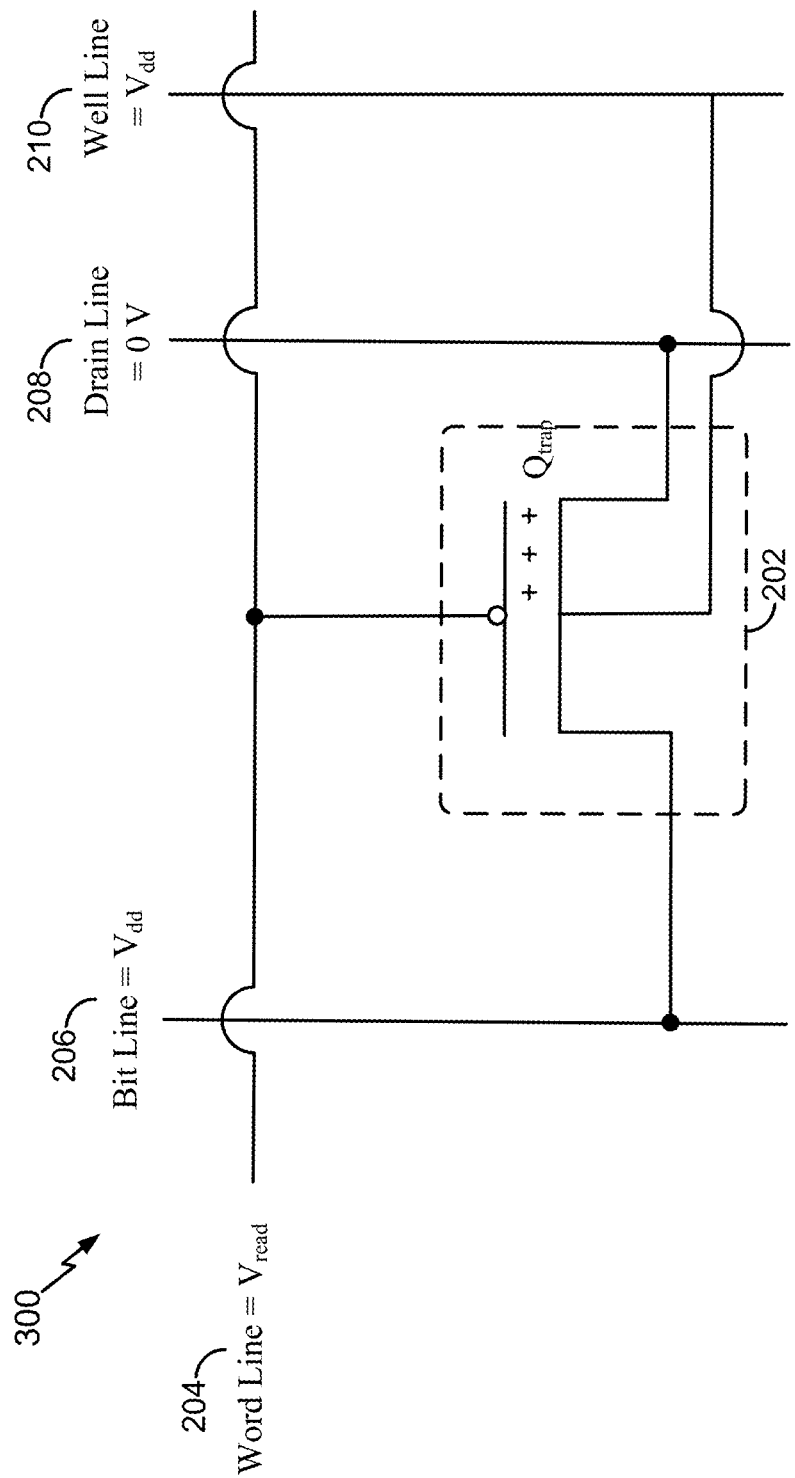
FIG. 3 is a diagram of a particular illustrative embodiment of performing a read operation on the OTP memory device of FIG. 2.

Referring to FIG. 3, a diagram of a particular illustrative embodiment 300 of performing a read operation on the OTP memory device 202 of FIG. 2 is shown.

During a read operation (e.g., a sensing operation), the bit line 206 may apply the supply voltage (Vdd) to the source of the OTP memory device 202, the drain line 208 may apply a ground voltage (e.g., 0 V) to the drain of the OTP memory device 202, the word line 204 may apply a read voltage ($V_{read}$) to the gate of the OTP memory device 202, and the well line 210 may apply the supply voltage (Vdd) to the well of the OTP memory device 202.

If no trap charge (e.g., if the OTP memory device 202 has the first pre programmable state), the threshold voltage of the OTP memory device 202 may be relatively low. Thus, the read voltage ($V_{read}$) may be greater than the threshold voltage, causing a channel of the OTP memory device 202 to turn on and have higher drain current (e.g., causing an inversion channel region of the OTP memory device 202 to increase) and thereby to substantially higher read current between the source and the drain.

If the trap charge existed (e.g., if the OTP memory device 202 has the second non-volatile programmable state), the threshold voltage of the OTP memory device 202 may be relatively high. Thus, the read voltage ($V_{read}$) may be still greater than the threshold voltage, causing the channel to turn on weakly (e.g., causing the inversion region to decrease) and smaller read current between the source and the drain.

A sensing amplifier may compare the "conductivity" of the OTP memory device 202 to that of a reference device (e.g., a reference transistor) to determine whether the OTP memory device 202 corresponds to the first pre state or to the second non-volatile state. For example, the current or voltage across the OTP memory device 202 (e.g., a first cell) may be compared to the current or voltage across the reference device (e.g., a second cell) to determine the non-volatile state of the OTP memory device 202.

The techniques described with respect to FIG. 2 may enable high-dielectric constant (k) metal-gate (HK/MG) devices (e.g., the OTP memory device 202) to be implemented as a non-volatile storage device. For example, non-volatile states corresponding to logic values may be sensed from the OTP memory device 202 based on the charge trap. The techniques described with respect to FIG. 2 may also enable a silicon oxide poly gate (poly/SiON) device.

Figure 4:
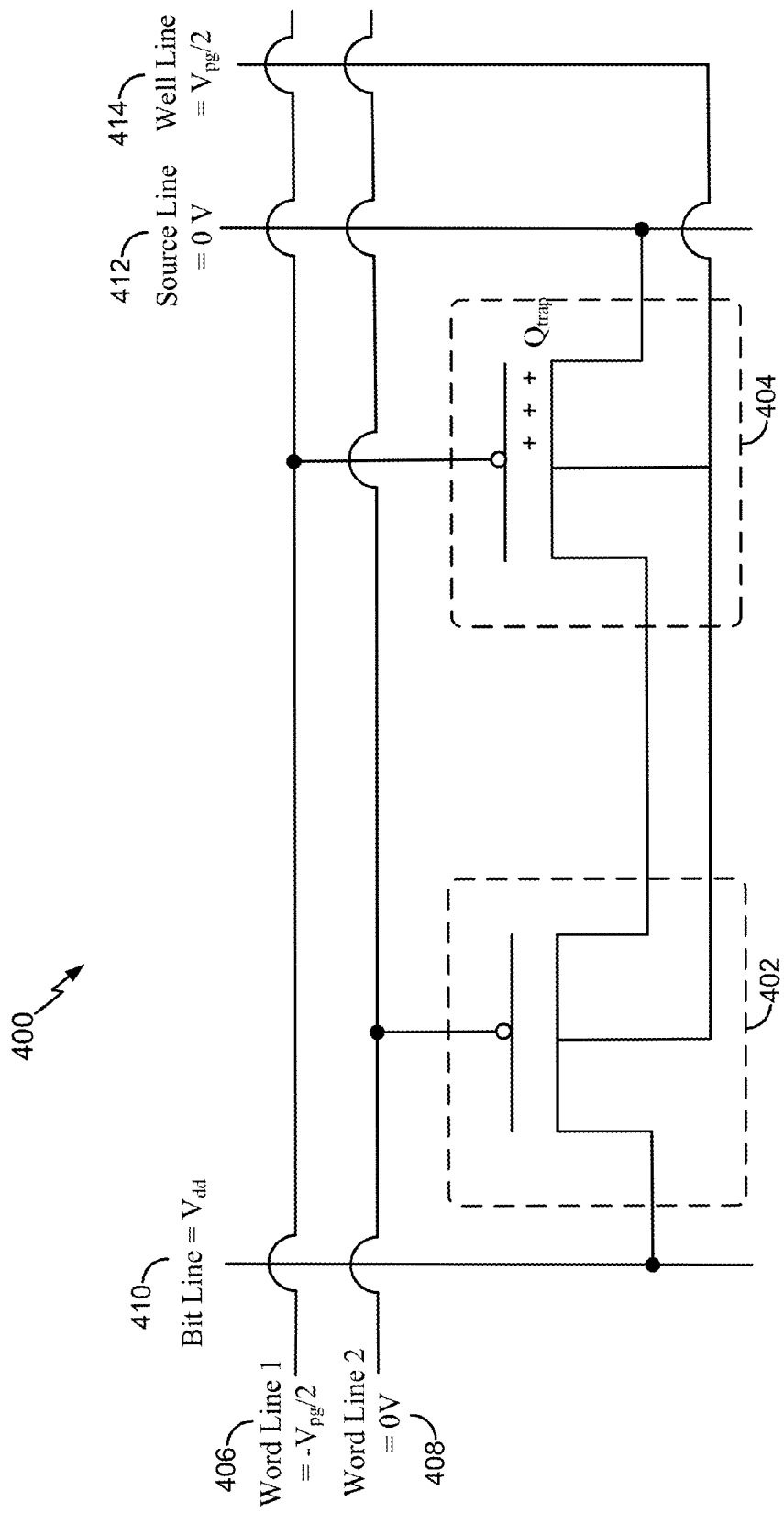
FIG. 4 is a diagram of a particular illustrative embodiment of performing a write operation on a OTP memory device in a two-transistor configuration.

Referring to FIG. 4, a diagram of a particular illustrative embodiment 400 of performing a write operation on a one-time programmable (OTP) memory device 404 in a two-transistor configuration is shown. In a particular embodiment, the OTP memory device 404 may correspond to the device of FIG. 1B. An access transistor 402 may be coupled to the OTP memory device 404. The two-transistor configuration of FIG. 4 may enable a separate word line (e.g., a word line coupled to the access transistor 402) to control selection of the OTP memory device 404.

A first word line 406 may be coupled to a gate of the OTP memory device 404. For example, the first word line 406 may be coupled to provide the gate voltage to the metal gate 102 of the device of FIG. 1A via the first contact 116. A second word line 408 may be coupled to a gate of the access transistor 402.

A bit line 410 may be coupled to a source of the of the access transistor 402, and a source line 412 may be coupled to a drain of the OTP memory device 404. For example, the source line 412 may be coupled to provide the drain voltage to the drain 112 of the device of FIG. 1A via the third contact 120. A drain of the access transistor 402 may be coupled to a source of the OTP memory device 404. For example, the drain of the access transistor 402 may be coupled to provide the source voltage to the source 110 of the device of FIG. 1B via the second contact 118. A well line 414 may be coupled to a well of the access transistor 402 and to a well (e.g., the substrate material 108) of the OTP memory device 404.

During the write operation, the bit line 410 may apply the supply voltage (Vdd) or half program voltage to the source of the access transistor 402, the source line 412 may apply the ground voltage (e.g., 0 V) to the drain of the OTP memory device 404, the second word line 408 may apply the ground voltage to the gate of the access transistor 402, and the first word line 406 may apply a first write voltage (e.g., $-V_{pg}/2$) to the gate of the OTP memory device 404. Additionally, the well line 414 may apply a second write voltage (e.g., $V_{pg}/2$) to the well of the OTP memory device 404 and to the well of the access transistor 402.

Applying the first write voltage ($-V_{pg}/2$) to the gate of the OTP memory device 404 and applying the second write voltage ($V_{pg}/2$) to the well of the OTP memory device 404 may cause charge trapped in dielectric layers of the OTP memory device 404 to change threshold voltage. For example, the write voltage ($-V_{pg}/2$) may cause the charge trapped inside dielectric layers (e.g., the trap charge 114 of FIG. 1B) to increase threshold voltage as described with respect to the second embodiment 150 of FIG. 1B. Adding the trap charge may change the state of the OTP memory device 404 from the first pre programmable state to the second non-volatile programmable state.

Applying the first write voltage ($-V_{pg}/2$) to the gate of the OTP memory device 404 and applying the second write voltage ($V_{pg}/2$) to the well of the OTP memory device 404 may also generate a pre soft breakdown, a soft breakdown, or a hard breakdown at the gate of the OTP memory device 404. For example, the potential (e.g., the voltage difference) across the gate dielectric may be large enough such that a "breakdown condition" occurs at the gate and a conduct path is formed in the gate dielectric layer, which prohibits the gate from controlling current between the source and the drain. Thus, the hard breakdown at the gate may prohibit the non-volatile programmable state of the OTP memory device 404 to switch back to the first pre programmable state. For soft breakdown, the gate current is in compliance and no hard conduct path is formed in the gate dielectric film. In a particular embodiment, a soft conduct path may exist in the gate dielectric film for a soft breakdown. The gate voltage may control channel current between the source and the drain. For pre soft breakdown, the threshold voltage starts to switch and the OTP device operates as a high threshold voltage device without a gate current increase. The high threshold voltage state cannot switch back to first pre program state for soft or pre soft breakdown program.

Because the voltage applied to the gate of the OTP memory device 404 is negative (e.g., smaller than the voltage applied to the gate of the access transistor 402), the potential across the gate of the access transistor 402 may be smaller than the potential across the gate of the OTP memory device 404. The reduced potential across the gate of the access transistor 402 may prevent an OTP program condition from occurring at the access transistor 402.

During a read operation (e.g., a sensing operation), the bit line 410 may apply a supply voltage (Vdd) to the source of the access transistor 402, and the source line 412 may apply a ground voltage (e.g., 0 V) to the drain of the OTP memory device 404. The second word line 408 may apply the ground voltage to the gate of the access transistor 402 to enable conduction (e.g., cell selection), and the well line 414 may apply the supply voltage (Vdd) to the wells of the access transistor 402 and the OTP memory device 404. To determine (e.g., read) the non-programmable state of the OTP memory device 404, the first word line 406 may apply a read voltage ($V_{read}$) to the gate of the OTP memory device 404.

If no trap charge in dielectric layers (e.g., if the OTP memory device 404 has the first pre programmable state), the threshold voltage of the OTP memory device 404 may be relatively low. Thus, the read voltage ($V_{read}$) may be greater than the threshold voltage, causing a channel of the OTP memory device 404 to turn on and have higher drain current (e.g., causing an inversion channel region of the OTP memory device 404 to increase) and to substantially higher read current between the source and the drain.

If the trap charge in the dielectric layers (e.g., if the OTP memory device 404 has the second non-volatile programmable state), the threshold voltage of the OTP memory device 404 may be relatively high. Thus, in this case the read voltage ($V_{read}$) may be still higher than the threshold voltage, causing the channel to turn on weakly (e.g., causing the inversion channel region to decrease) and causing smaller read current between the source and the drain.

A sensing amplifier may compare the "conductivity" of the OTP memory device 404 to that of a reference device (e.g., a reference transistor) to determine whether the OTP memory device 404 corresponds to the first pre state or to the second non-volatile state. For example, the current or voltage across the OTP memory device 404 (e.g., a first cell) may be compared to the current or voltage across the reference device (e.g., a second cell) to determine the non-volatile state of the OTP memory device 404.

Figure 5:
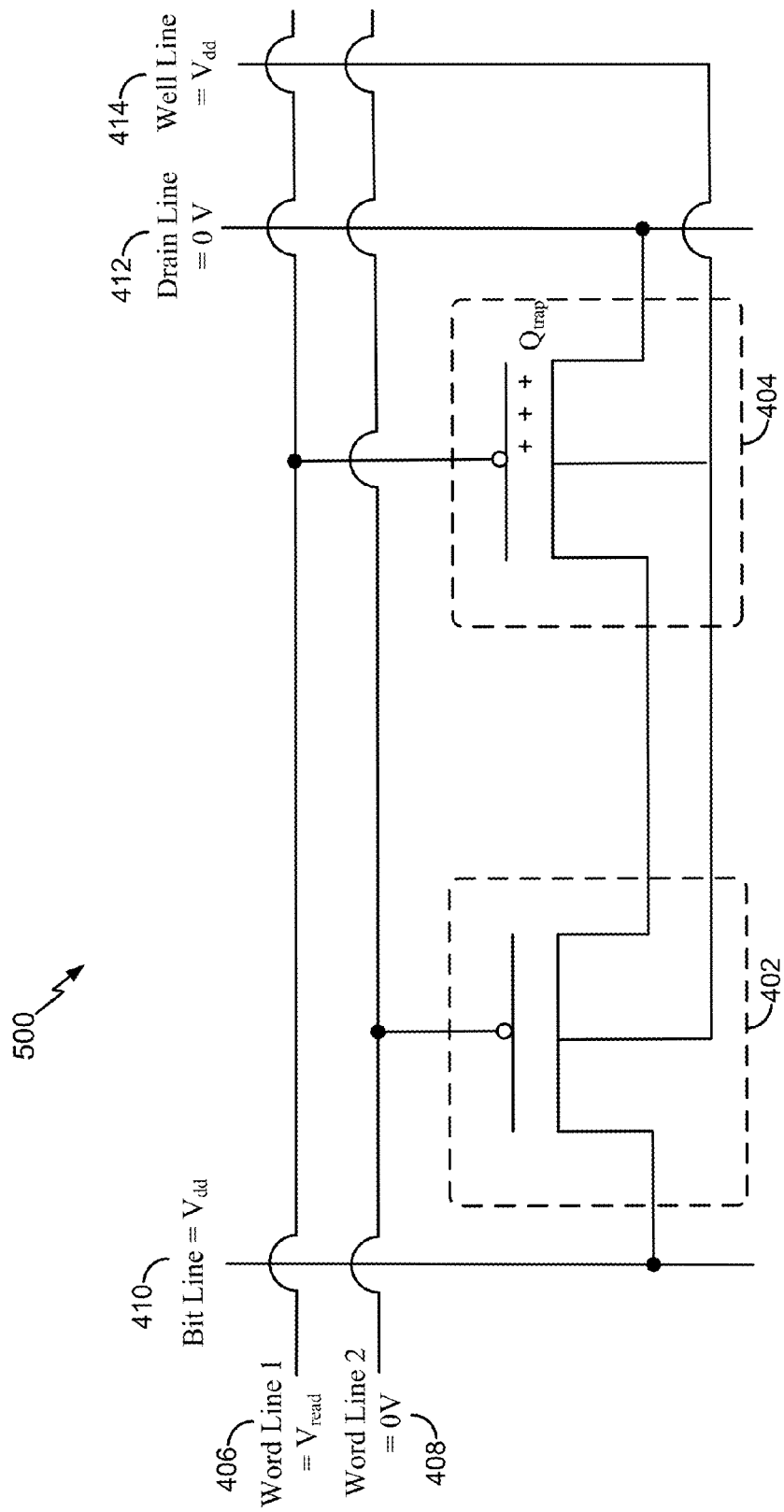
FIG. 5 is a diagram of a particular illustrative embodiment of performing a read operation on the OTP memory device of FIG. 4.

The techniques described with respect to FIG. 5 may enable high-dielectric constant (k) metal-gate (HK/MG) devices (e.g., the OTP memory device 404) to be implemented as a non-volatile storage device. For example, non-volatile states corresponding to logic values may be sensed from the OTP memory device 504 based on the charge trap. The techniques described with respect to FIG. 5 may also enable a silicon oxide poly gate (poly/SiON) device.

Figure 6:
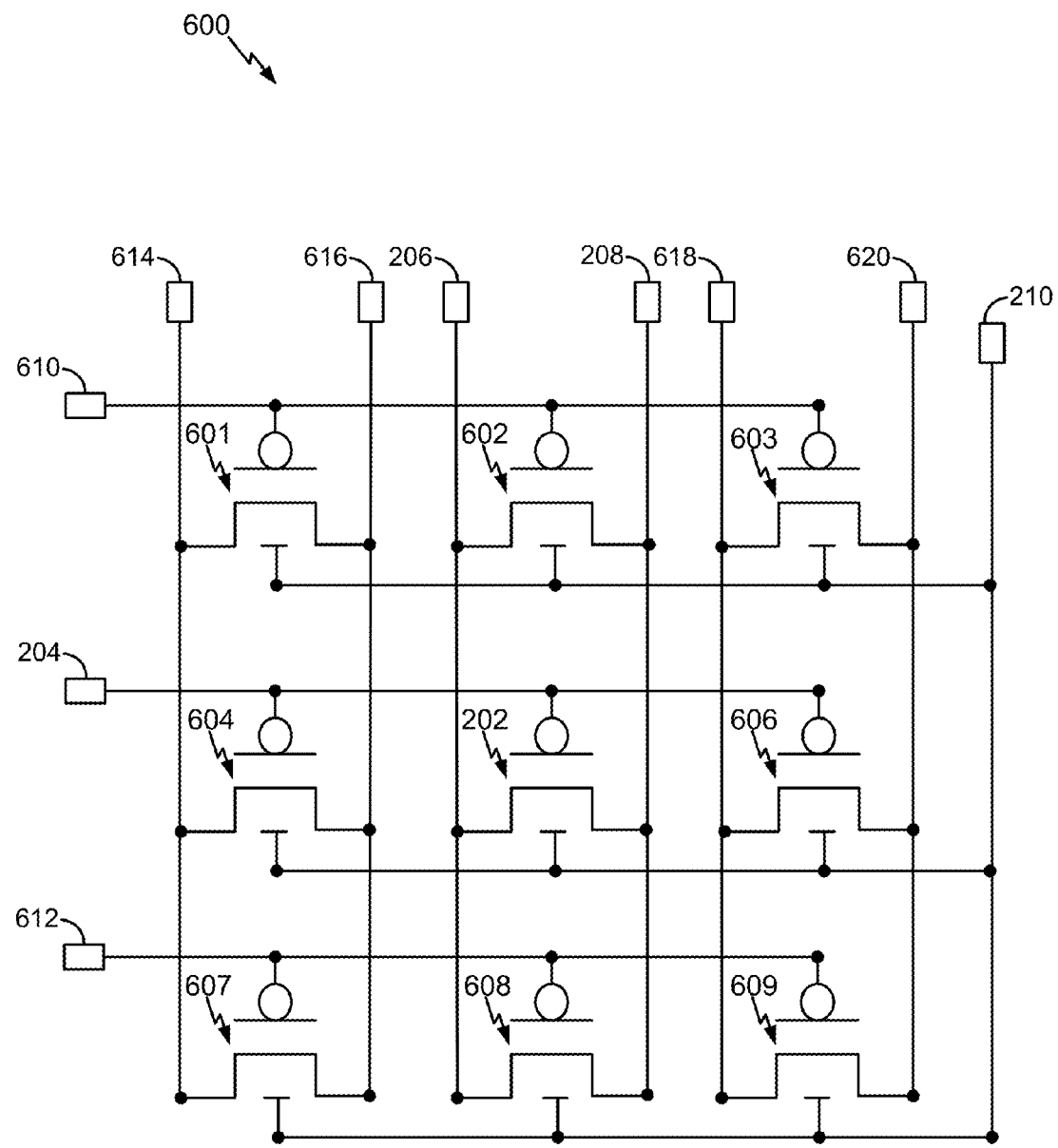
FIG. 6 is a diagram of a particular illustrative embodiment of a high-density OTP memory array that includes the OTP device of FIG. 2.

Referring to FIG. 6, a particular illustrative embodiment of a high-density OTP memory array 600 is shown. The memory array 600 may include a plurality of memory cells. Each memory cell in the memory array 600 includes an OTP memory device (e.g., a single PMOS transistor as opposed to two transistors) to enable a relatively large number of memory cells in the memory array 600 (e.g., a high-density memory array).

To illustrate, a first OTP memory device 601 may be included in a first memory cell of the memory array 600, a second OTP memory device 602 may be included in a second memory cell of the memory array 600, a third OTP memory device 603 may be included in a third memory cell of the memory array 600, a fourth OTP memory device 604 may be included in a fourth memory cell of the memory array 600, and the OTP memory device 202 of FIG. 2 (e.g., a fifth OTP memory device) may be included in a fifth memory cell of the memory array 600. Additionally, a sixth OTP memory device 606 may be included in a sixth memory cell of the memory array 600, a seventh OTP memory device 607 may be included in a seventh memory cell of the memory array 600, an eighth OTP memory device 608 may be included in an eighth memory cell of the memory array 600, and a ninth OTP memory device 609 may be included in a ninth memory cell of the memory array 600.

The word line 204 of FIG. 2 may be coupled to the gate of the OTP memory device 202. For example, the OTP memory device 202 may correspond to the device of FIG. 1B and the word line 204 may be coupled to provide the gate voltage to the metal gate 102 of the device of FIG. 1A via the first contact 116. The word line 204 may also be coupled to the gate of the fourth OTP memory device 604 and to the gate of the sixth OTP memory device 606. The bit line 206 of FIG. 2 may be coupled to the source of the OTP memory device 202. For example, the bit line 206 may be coupled to provide the source voltage to the source of the device of FIG. 1A via the second contact. The bit line 206 may also be coupled to the source of the second OTP memory device 602 and to the source of the eighth OTP memory device 608.

The drain line 208 of FIG. 2 may be coupled to the drain of the OTP memory device 202. For example, the drain line 208 may be coupled to provide the drain voltage to the drain 112 of the device of FIG. 1A via the third contact 120. The drain line 208 may also be coupled to the drain of the second OTP memory device 602 and to the drain of the eighth OTP memory device 608. The well line 210 of FIG. 2 may be coupled to the well of the OTP memory device 202 (e.g., the substrate material of FIG. 1A). The well line 210 may also be coupled to the wells of the other OTP memory devices 601-604, 606-609 in the memory array 600.

During program conditions (e.g., write operations), the threshold voltage of an OTP memory device may shift at least 300 mV. Below, program conditions are described with respect to the OTP memory device 202 in the memory array 600. However, similar techniques may be applied to the other OTP memory devices 601-604, 606-609 to achieve similar results and similar technical benefits. For example, other word lines 610, 612, other bit lines 614, 618, and other drain lines 616, 620 may apply voltages to the other OTP memory devices 601-604, 606-609 in a substantially similar manner as described with respect to the OTP memory device 202 below.

During a first program condition (e.g., a "select" program condition), the word line 204 may apply a gate voltage (e.g., −3V) to the gate of the OTP memory device 202 and the bit line 206 may apply a source voltage (e.g., 0V) to the source of the OTP memory device 202 such that the programming voltage (e.g., $V_{GS}$) is approximately equal to (or lower than) 3V. Additionally, the drain line 208 may apply a drain voltage (e.g., −2V) to the drain of the OTP memory device 202 and the well line 210 may apply a well voltage (e.g., 0V) to the well of the OTP memory device 202. The programming current (e.g., $I_{DS}$) may be lower than 1 milli-ampere (mA), which may conserve power during programming. The programming voltage in conjunction with the programming current may provide a threshold voltage shift at the OTP memory device 202 to change the state of the OTP memory device 202 from a first non-volatile state (e.g., a pre-programmed state) to a second non-volatile state.

During a second program condition (e.g., a "half select" program condition), the word line 204 may apply a gate voltage (e.g., −1.5V) to the gate of the OTP memory device 202 and the bit line 206 may apply a source voltage (e.g., 0V) to the source of the OTP memory device 202 such that the programming voltage is approximately 1.5V (e.g., approximately half the programming voltage of the first program condition). Similar to the first program condition, the drain line 208 may apply the drain voltage (e.g., −2V) to the drain of the OTP memory device 202 and the well line 210 may apply the well voltage (e.g., 0V) to the well of the OTP memory device 202. According to the second program condition, the threshold voltage shift at the OTP memory device 202 may not change the state of the OTP memory device 202 from the first non-volatile state to the second non-volatile state.

The programming conditions may exhibit reduced gate leakage at the OTP memory device 202 compared to a Kilopass-type OTP memory device. For example, a Kilopass-type OTP memory device may exhibit a relatively large increase of gate leakage after programming (gate anti-fuse), and the OTP memory device 202 may exhibit a smaller increase in gate leakage compared to the Kilopass-type OTP memory device but the program is the transistor threshold voltage. Additionally, the programming conditions may exhibit reduced activation energy compared to a Kilopass-type OTP memory device. As a non-limiting example, the OTP memory device 202 may utilize 0.22 eV of activation energy and a Kilopass-type OTP memory device may utilize 0.55 ev of activation energy.

Below, read conditions (e.g., read operations) are described with respect to the OTP memory device 202 in the memory array 600. However, similar techniques may be applied to the other OTP memory devices 601-604, 606-609 to achieve similar results and similar technical benefits. For example, other word lines 610, 612, other bit lines 614, 618, and other drain lines 616, 620 may apply voltages to the other OTP memory devices 601-604, 606-609 in a substantially similar manner as described with respect to the OTP memory device 202 below.

To perform a sensing operation (e.g., a read operation) at the OTP memory device 202, the word line 204 may apply a gate voltage (e.g., −0.5V) to the gate of the OTP memory device 202 and the bit line 206 may apply a source voltage (e.g., 0V) to the source of the OTP memory device 202. Additionally, the drain line 208 may apply a drain voltage (e.g., −1V) to the drain of the OTP memory device 202 and the well line 210 may apply a well voltage (e.g., 0V) to the well of the OTP memory device 202. A sensing amplifier may compare the "conductivity" of the OTP memory device 202 to that of a reference device (e.g., a reference transistor) to determine whether the OTP memory device 202 corresponds to the first non-volatile state (e.g., the pre-programmed state) or to the second non-volatile state (e.g., the programmed state). For example, the current or voltage across the OTP memory device 202 (e.g., a fifth cell of the memory array 600) may be compared to the current or voltage across the reference device (e.g., a second cell) to determine the non-volatile state of the OTP memory device 202.

If the OTP memory device 202 is in the first non-volatile state (e.g., the pre-programmed state), the read current may be greater than 10 micro-amperes (uA). The read current may comparable to an SRAM cell read current, which may improve cell sensing speed. For example, the cell sensing speed may be fast enough to directly communicate with a central processing unit (CPU) as opposed to slower sensing speed that may utilize pre-reading operations at a cache. If the OTP memory device 202 is in the second non-volatile state (e.g., the post-programmed state), the read current may be less than 0.3 uA. To unselect the fifth cell (e.g., the OTP memory device 202) during reading operations, the word line 204 may increase the gate voltage. For example, the word line may increase the gate voltage from −0.5V to 0V.

Figure 7:
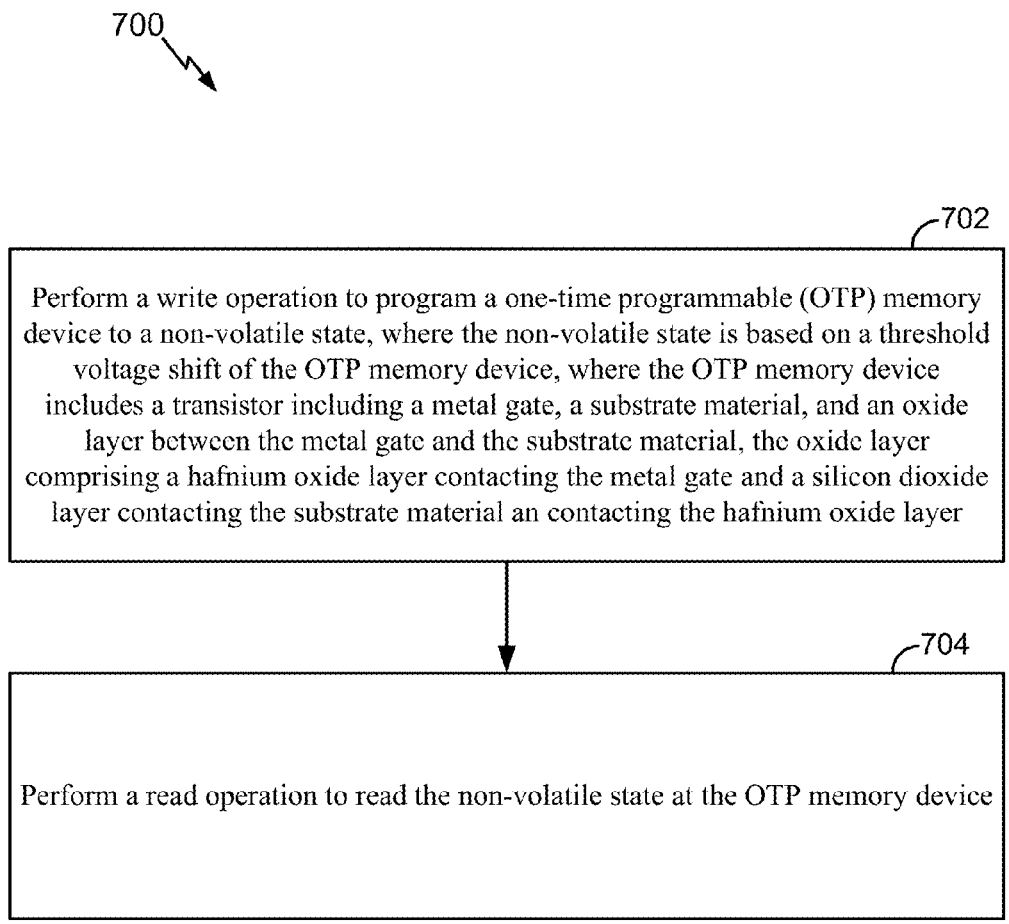
FIG. 7 is a flowchart of a particular embodiment of a method for programming an OTP memory device.

Referring to FIG. 7, a flowchart of a particular embodiment of a method 700 for programming a one-time programmable (OTP) memory device is shown. The method may be performed using the techniques described with respect to FIGS. 1-6.

The method 700 includes performing a write operation to program a one-time programmable (OTP) memory device to a non-volatile state, at 702. The non-volatile state may be based on a threshold voltage shift of the OTP memory device, and the OTP memory device may be a transistor that includes a metal gate, a substrate material, and an oxide layer between the metal gate and the substrate material. The oxide layer includes a hafnium oxide layer contacting the metal gate and a silicon dioxide layer contacting the substrate material and contacting the hafnium oxide layer.

For example, referring to FIG. 1A, a first write voltage (e.g., the first write voltage ($-V_{pg}/2$) of FIG. 2) may be applied to the metal gate 102 via the first contact and a second write voltage (e.g., the second write voltage ($V_{pg}/2$) of FIG. 2) may be applied to the substrate material 108. Applying the first write voltage ($-V_{pg}/2$) to the metal gate 102 and applying the second write voltage ($V_{pg}/2$) to the substrate material 108 may cause the charge trapped in dielectric layers of the OTP memory device to change the threshold voltage. For example, the first write voltage ($-V_{pg}/2$) may cause the charge trapped in dielectric layers of FIG. 1B to switch to the higher threshold voltage as described with respect to the second embodiment 150 of FIG. 1B. Adding the trap charge in dielectric layers may change the state of the OTP memory device from the first pre programmable state to the second non-volatile programmable state.

Applying the first write voltage ($-V_{pg}/2$) to the metal gate 102 and applying the second write voltage ($V_{pg}/2$) to the substrate material 108 may also generate a pre soft breakdown, a soft breakdown, or a hard breakdown at the gate of the OTP memory device. For example, the potential (e.g., the voltage difference) across the oxide 104 and 106 may be large enough such that a "breakdown condition" occurs at the oxide 104 and 106 and a conduct path is formed in the gate dielectric layer to prohibit the metal gate 102 from controlling current between the source 110 and the drain 112. Thus, the hard breakdown at the metal gate 102 may prohibit the non-volatile programmable state of the OTP memory device to switch back to the first pre programmable state. For soft breakdown, the gate current is in compliance and no hard conduct path is formed in the gate dielectric film. In a particular embodiment, a soft conduct path may exist in the gate dielectric film for a soft breakdown. The gate voltage may control channel current between the source and the drain. For pre soft breakdown, the threshold voltage starts to switch and the OTP device operates as a high threshold voltage device without a gate current increase. The high threshold voltage state cannot switch back to first pre program state for soft or pre soft breakdown program.

A read operation may be performed to read the non-volatile state at the OTP memory device, at 704. For example, referring to FIG. 1B, a sensing amplifier may compare the "conductivity" of the OTP memory device to that of a reference device (e.g., a reference transistor) to determine whether the OTP memory device corresponds to the first pre state or to the second non-volatile state. For example, the current or voltage across the OTP memory device (e.g., a first cell) may be compared to the current or voltage across the reference device (e.g., a second cell) to determine the non-volatile state of the OTP memory device.

Thus, the method 700 of FIG. 7 enables use of a high-dielectric constant (k) metal-gate (HK/MG) device as a non-volatile memory device for a logic circuit.

Figure 8:
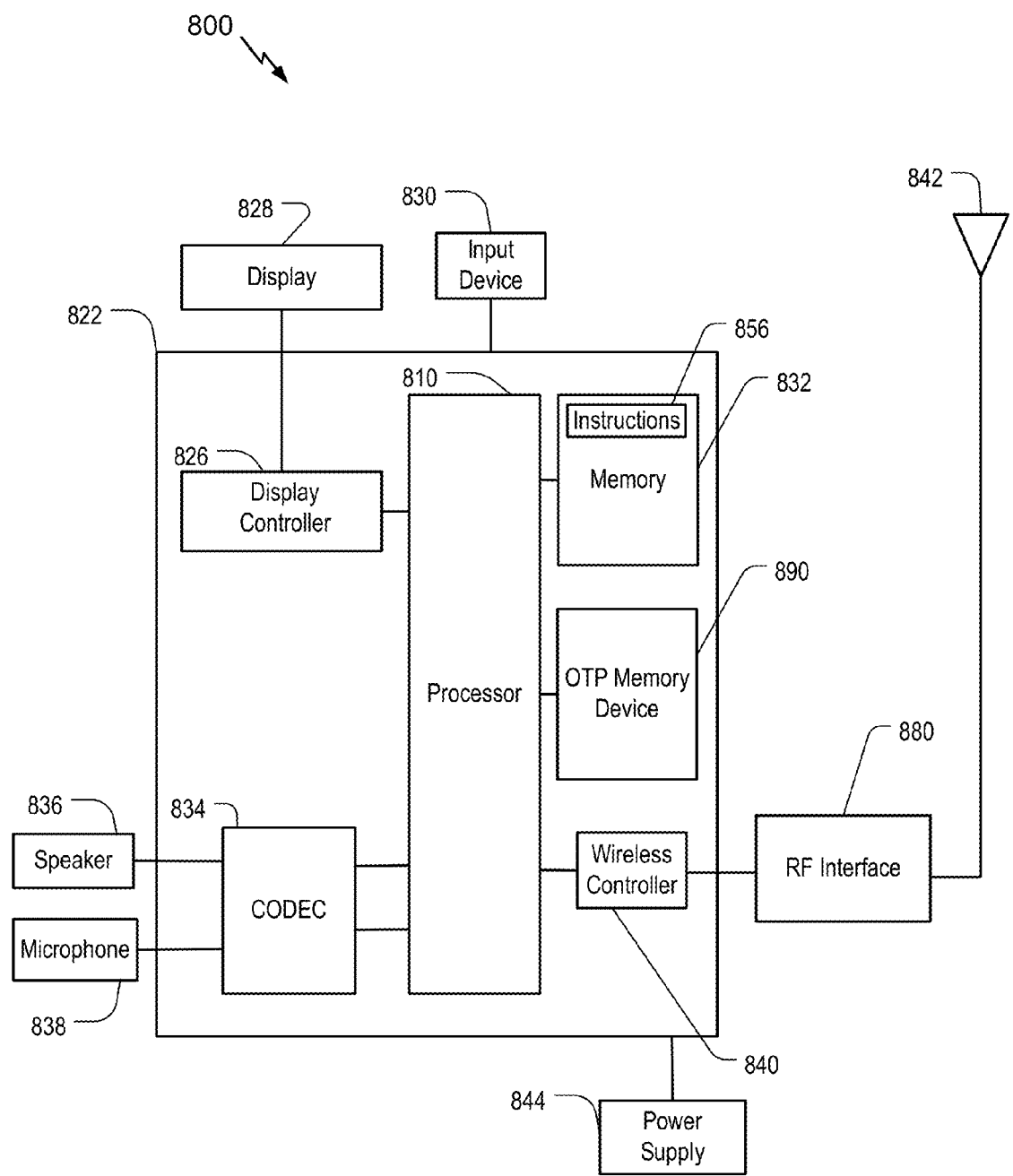
FIG. 8 is a block diagram of a wireless device including a component operable to program an OTP memory device.

Referring to FIG. 8, a block diagram of a wireless device 800 including components operable to program a one-time programmable (OTP) memory device 890 is shown. The device 800 includes a processor 810, such as a digital signal processor (DSP), coupled to a memory 832.

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834. FIG. 8 also indicates that a wireless controller 840 can be coupled to the processor 810 and to an antenna 842. A radio frequency (RF) interface 880 may be disposed between the wireless controller 840 and the antenna 842.

The memory 832 may be a tangible non-transitory processor-readable storage medium that includes executable instructions 856. The instructions 856 may be executed by a processor, such as the processor 810 to perform the method 700 of FIG. 7. For example, the instructions 856 may be executable by the processor 810 to cause the processor 810 to bias terminals of the OTP memory device 890. In a particular embodiment, the OTP memory device 890 may correspond to, or include, the device of FIG. 1A, the OTP memory device 202 of FIGS. 2-3, the OTP memory device 404 of FIGS. 4-5, an array of OTP memory devices, such as the memory array 600 of FIG. 6, or any combination thereof. In another particular embodiment, the OTP memory device 890 may be included in the processor 810 or other logic that include CMOS circuitry.

In a particular embodiment, the processor 810, the display controller 826, the memory 832, the CODEC 834, and the wireless controller 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 can be coupled to a component of the system-on-chip device 822, such as an interface or a controller.

In conjunction with the described embodiments, an apparatus includes means for receiving a gate voltage signal. For example, the means for receiving the gate voltage signal may the metal gate 102 of FIG. 1B, one or more other devices, circuits, modules, or any combination thereof.

The apparatus may also include means for isolating a substrate material from the means for receiving the gate voltage signal. For example, the means for isolating may include the hafnium oxide layer 104 of FIG. 1B, the silicon dioxide layer 106 of FIG. 1B, one or more other devices, circuits, modules, or any combination thereof.

Figure 9:
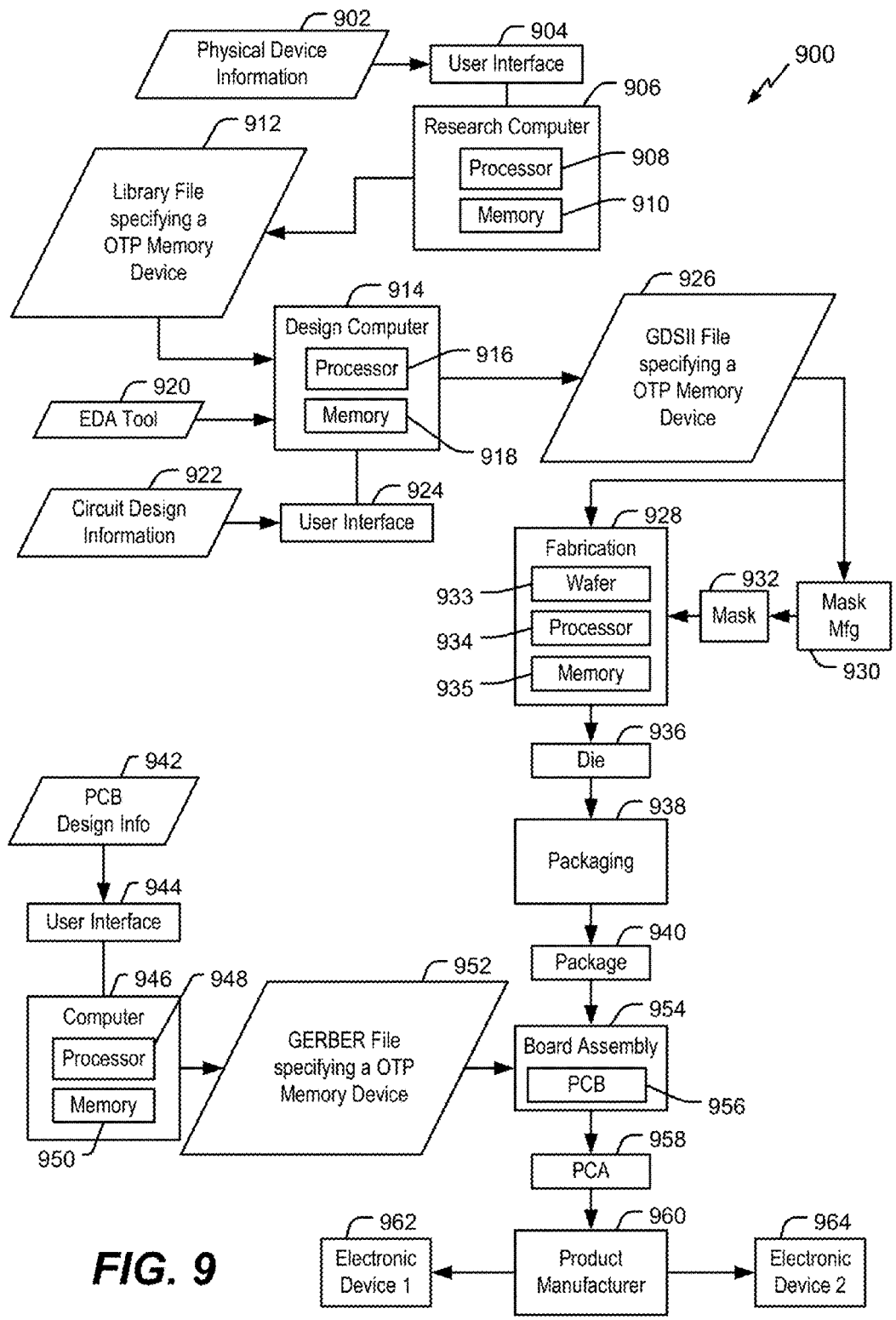
FIG. 9 is a data flow diagram of a particular illustrative embodiment of a manufacturing process to manufacture electronic devices that include a component operable to program an OTP memory device.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 9 depicts a particular illustrative embodiment of an electronic device manufacturing process 900.

Physical device information 902 is received at the manufacturing process 900, such as at a research computer 906. The physical device information 902 may include design information representing at least one physical property of an OTP memory device, such as a physical property of a device described with reference to FIGS. 1-6. For example, the physical device information 902 may include physical parameters, material characteristics, and structure information that is entered via a user interface 904 coupled to the research computer 906. The research computer 906 includes a processor 908, such as one or more processing cores, coupled to a computer-readable medium such as a memory 910. The memory 910 may store computer-readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of OTP memory devices (e.g., semiconductor devices), including an OTP memory device described with reference to FIGS. 1-6, provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including an OTP memory device described with reference to FIGS. 1-6, using the library file 912. For example, a user of the design computer 914 may enter circuit design information 922 via a user interface 924 coupled to the design computer 914. The circuit design information 922 may include design information representing at least one physical property of an OTP memory device, such as an OTP memory device described with reference to FIGS. 1-6. To illustrate, the circuit design property may include identification of particular circuits and relationships to other elements in a circuit design, positioning information, feature size information, interconnection information, or other information representing a physical property of an electronic device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing an OTP memory device described with reference to FIGS. 1-6, in addition to other circuits or information. To illustrate, the data file may include information corresponding to a system-on-chip (SOC) or a chip interposer component that that includes an OTP memory device described with reference to FIGS. 1-6, and that also includes additional electronic circuits and components within the SOC.

The GDSII file 926 may be received at a fabrication process 928 to manufacture an OTP memory device described with reference to FIGS. 1-6 according to transformed information in the GDSII file 926. For example, a device manufacture process may include providing the GDSII file 926 to a mask manufacturer 930 to create one or more masks, such as masks to be used with photolithography processing, illustrated in FIG. 9 as a representative mask 932. The mask 932 may be used during the fabrication process to generate one or more wafers 933, which may be tested and separated into dies, such as a representative die 936. The die 936 includes a circuit including an OTP memory device described with reference to FIGS. 1-6.

In a particular embodiment, the fabrication process 928 may be initiated by or controlled by a processor 934. The processor 934 may access a memory 935 that includes executable instructions such as computer-readable instructions or processor-readable instructions. The executable instructions may include one or more instructions that are executable by a computer, such as the processor 934.

The fabrication process 928 may be implemented by a fabrication system that is fully automated or partially automated. For example, the fabrication process 928 may be automated and may perform processing steps according to a schedule. The fabrication system may include fabrication equipment (e.g., processing tools) to perform one or more operations to form an electronic device. For example, the fabrication equipment may be configured to perform one or more of the processes described with reference to FIGS. 1-6 using integrated circuit manufacturing processes (e.g., wet etching, chemical vapor etching, dry etching, deposition, chemical vapor deposition, planarization, lithography, in-situ baking, or a combination thereof).

The fabrication system may have a distributed architecture (e.g., a hierarchy). For example, the fabrication system may include one or more processors, such as the processor 934, one or more memories, such as the memory 935, and/or controllers that are distributed according to the distributed architecture. The distributed architecture may include a high-level processor that controls or initiates operations of one or more low-level systems. For example, a high-level portion of the fabrication process 928 may include one or more processors, such as the processor 934, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 934.

Alternatively, the processor 934 may be a part of a high-level system, subsystem, or component of the fabrication system. In another embodiment, the processor 934 includes distributed processing at various levels and components of a fabrication system.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged electronic device on a circuit board, the packaged electronic device corresponding to the package 940 including an OTP memory device described with reference to FIGS. 1-6.

The computer 946 may be configured to transform the PCB design information 942 to generate a data file, such as a GERBER file 952 with data that includes physical positioning information of a packaged electronic device on a circuit board, as well as layout of electrical connections such as traces and vias, where the packaged electronic device corresponds to the package 940 including an OTP memory device described with reference to FIGS. 1-6. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacturer 960 and integrated into one or more electronic devices, such as a first representative electronic device 962 and a second representative electronic device 964. As an illustrative, non-limiting example, the first representative electronic device 962, the second representative electronic device 964, or both, may be selected from a set top box, a music player, a video player, an entertainment unit, a navigation device, a communications device, a personal digital assistant (PDA), a fixed location data unit, and a computer, into which an OTP memory device described with reference to FIGS. 1-6, is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 9 illustrates remote units according to teachings of the disclosure, the disclosure is not limited to these illustrated units. Embodiments of the disclosure may be suitably employed in any device which includes active integrated circuitry including memory and on-chip circuitry.

A device that includes an OTP memory device described with reference to FIGS. 1-6, may be fabricated, processed, and incorporated into an electronic device, as described in the illustrative manufacturing process 900. One or more aspects of the embodiments disclosed with respect to FIGS. 1-6 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages are depicted with reference to FIGS. 1-8, in other embodiments fewer stages may be used or additional stages may be included. Similarly, the process 900 of FIG. 9 may be performed by a single entity or by one or more entities performing various stages of the manufacturing process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a metal gate;
a substrate material; and
an oxide layer including a hafnium oxide layer in contact with each of the metal gate and a silicon dioxide layer on the substrate material, the oxide layer included in a memory cell at a circuit configured to program the memory cell to a non-volatile state in which the memory cell stores a logical value and is in a soft-breakdown condition.

2. The apparatus of claim 1, wherein the memory cell includes a transistor, wherein the non-volatile state is based on a threshold voltage shift and corresponds to a pre soft-breakdown condition or the soft-breakdown condition, and wherein the transistor is associated with a channel current controllable according to an application, via the circuit, of a gate voltage at the metal gate.

3. The apparatus of claim 1, wherein the non-volatile state comprises one of:
a pre-programmable state associated with a particular logical value; and
a non-volatile programmable state associated with a different logical value.

4. The apparatus of claim 1, further comprising:
a transistor that includes the oxide layer, wherein the transistor does not include a hard conduct path corresponding to a hard breakdown condition in the oxide layer; and
a processor configured to determine the logical value from the memory cell as logic "0" or logic "1" in response to sensing the non-volatile state.

5. The apparatus of claim 1, wherein the non-volatile state is based on a charge trap in a dielectric layer.

6. The apparatus of claim 1, wherein the memory cell is configured to switch from a first state to the non-volatile state but not back to the first state, and wherein the metal gate, the substrate material, and the oxide layer are integrated into at least one semiconductor die.

7. The apparatus of claim 1, wherein the memory cell includes a one-time programmable (OTP) memory device in a memory array, and wherein:
the non-volatile state is associated with:
a particular logical value if a threshold voltage of the OTP memory device is low; and
a different logical value if the threshold voltage is high; and
the memory array includes at least one other OTP memory device.

8. The apparatus of claim 1, wherein the memory cell includes a one-time programmable (OTP) memory device in a high-density OTP memory array configured to write the logical value to the OTP memory device and to read the logical value from the OTP memory device.

9. The apparatus of claim 1, wherein the memory cell is integrated into a communications device, a personal digital assistant (PDA), a set top box, a music player, a video player, an entertainment unit, a navigation device, a fixed location data unit, a computer, or a combination thereof.

10. A method comprising:
performing a write operation at a memory device that includes an oxide layer between a metal gate and a substrate material, the oxide layer comprising a hafnium oxide layer contacting the metal gate and comprising a silicon dioxide layer contacting the substrate material and contacting the hafnium oxide layer, the oxide layer included in a memory cell at a circuit, wherein performing the write operation includes programming, by the circuit, the memory cell to a non-volatile state in which the memory cell stores a logical value and is in a soft-breakdown condition; and
performing a read operation by the circuit to read the non-volatile state at the memory device.

11. The method of claim 10, wherein:
the memory cell includes a one-time programmable (OTP) memory device that includes a transistor,
in the non-volatile state current between a source and a drain of the transistor is controllable according to a gate voltage applied to the metal gate, and
the circuit applies the gate voltage to the metal gate to write the logical value to the OTP memory device.

12. The method of claim 10, wherein:
the memory cell includes a transistor,
the non-volatile state is based on a threshold voltage shift and corresponds to the soft-breakdown condition or a pre soft-breakdown condition at the transistor, and
performing the write operation creates the soft-breakdown condition or the pre soft-breakdown condition corresponding to the threshold voltage shift.

13. The method of claim 10, wherein the memory cell includes a transistor, and further comprising performing a write operation that creates a hard breakdown condition at the oxide layer prohibiting the metal gate from controlling current between a source and a drain of the transistor.

14. The method of claim 10, wherein the non-volatile state is based on a charge trapped between the hafnium oxide layer and the silicon dioxide layer, and wherein performing the write operation increases a threshold voltage of the memory device.

15. The method of claim 10, wherein the non-volatile state is based on a change in orientation of a ferroelectric field between the hafnium oxide layer and the silicon dioxide layer.

16. The method of claim 10, wherein:
the memory device and at least one other memory device are included in a memory array at an electronic device that includes a processor,
the processor reads the logical value as logic "0" or logic "1" by initiating sensing by the circuit of the non-volatile state in the read operation, and
the read operation is performed after the write operation.

17. The method of claim 10, wherein performing the read operation comprises determining, by a processor, the logical value at the memory device.

18. The method of claim 10, further comprising determining the non-volatile state based on a threshold voltage of the memory device, wherein the non-volatile state is determined by a processor at the memory device to be one of:
a pre programmable state associated with a logical value at the memory device; and
a non-volatile programmable state associated with another logical value at the memory device.

19. A non-transitory computer-readable medium comprising instructions that, when executed by a processor, cause the processor to:
initiate a write operation at a one-time programmable (OTP) memory device, wherein the OTP memory device includes a transistor including a metal gate with a soft-breakdown condition in a non-volatile state of the OTP memory device, a substrate material, and an oxide layer between the metal gate and the substrate material, the oxide layer comprising a hafnium oxide layer in contact with the metal gate and comprising a silicon dioxide layer in contact with the substrate material and with the hafnium oxide layer, the non-volatile state:
based on a threshold voltage shift of the OTP memory device; and
associated with a logical value at the OTP memory device; and
initiate a read operation to determine the logical value by reading the non-volatile state at the OTP memory device.

20. The non-transitory computer-readable medium of claim 19, wherein the non-volatile state corresponds to a pre soft-breakdown condition or the soft-breakdown condition, and wherein in the non-volatile state current between a source and a drain of the transistor is controllable according to a gate voltage at the metal gate.

21. The non-transitory computer-readable medium of claim 19, wherein the oxide layer is included in a memory cell at a circuit configured to program the memory cell to a particular non-volatile state in which the memory cell stores the logical value and is in the soft-breakdown condition, and wherein initiating the write operation causes the soft-breakdown condition.

22. The non-transitory computer-readable medium of claim 19, further comprising performing a write operation that causes a hard breakdown condition at the oxide layer.

23. The non-transitory computer-readable medium of claim 19, wherein initiating the write operation causes a threshold voltage increase of the memory device.

24. The non-transitory computer-readable medium of claim 19, wherein the non-volatile state is based on a charge trap between the hafnium oxide layer and the silicon dioxide layer.

25. The non-transitory computer-readable medium of claim 19, wherein the OTP memory device is included in a memory array with at least one other OTP memory device.

26. An apparatus comprising:
means for receiving a gate voltage signal;
a substrate material; and
means for isolating, wherein the means for isolating is configured to isolate the substrate material from the means for receiving, the means for isolating included in a memory cell at a circuit configured to program the memory cell to a non-volatile state in which the memory cell stores a logical value and is in a soft-breakdown condition, wherein the means for isolating includes:
a hafnium oxide layer in contact with the means for receiving; and
a silicon dioxide layer in contact with the substrate material and with the hafnium oxide layer.

27. The apparatus of claim 26, wherein the memory cell has a first non-volatile state associated with a first logical value if a threshold voltage of the memory cell is low and has a second non-volatile state associated with a second logical value if the threshold voltage is high.

28. The apparatus of claim 27, wherein the first non-volatile state is a pre-programmable state, and wherein the second non-volatile state is a non-volatile programmable state.

29. The apparatus of claim 26, further comprising means for determining the logical value at the memory cell.

30. The apparatus of claim 26, wherein the non-volatile state is based on a charge trap between the hafnium oxide layer and the silicon dioxide layer.

31. An apparatus comprising:
a metal gate;
a substrate material; and
an oxide layer including a hafnium oxide layer in contact with each of the metal gate and a silicon dioxide layer on the substrate material, the oxide layer included in a memory cell at a circuit, the memory cell programmed to a non-volatile state in which the memory cell stores a logical value and is in a soft-breakdown condition.

32. The apparatus of claim 31, wherein the memory cell includes a one-time programmable (OTP) memory device in a memory array, and further comprising a processor configured to determine the logical value from the memory cell.

33. The apparatus of claim 31, further comprising:
a transistor that includes the oxide layer, wherein the transistor does not include a hard conduct path corresponding to a hard breakdown condition in the oxide layer; and
a processor configured to determine the logical value from the memory cell as logic "0" or logic "1" in response to sensing the non-volatile state.

* * * * *